(12) United States Patent
Badoiu et al.

(10) Patent No.: US 9,690,768 B2
(45) Date of Patent: Jun. 27, 2017

(54) ANNOTATING VIDEO INTERVALS

(71) Applicant: Google Inc., Mountain View, CA (US)

(72) Inventors: Mihai Badoiu, New York, NY (US);
Shanmugavelayutham Muthukrishnan, New York, NY (US)

(73) Assignee: Google Inc., Mountain View, CA (US)

( * ) Notice: Subject to any disclaimer, the term of this patent is extended or adjusted under 35 U.S.C. 154(b) by 486 days.

(21) Appl. No.: 14/145,786

(22) Filed: Dec. 31, 2013

(65) Prior Publication Data

US 2014/0115441 A1    Apr. 24, 2014

Related U.S. Application Data

(63) Continuation of application No. 13/341,131, filed on Dec. 30, 2011, which is a continuation of application
(Continued)

(51) Int. Cl.
*G06F 17/00* (2006.01)
*G06F 17/24* (2006.01)
(Continued)

(52) U.S. Cl.
CPC ........ *G06F 17/241* (2013.01); *G06F 17/3082* (2013.01); *G06F 17/30864* (2013.01);
(Continued)

(58) Field of Classification Search
CPC .... G06F 17/241; G06F 17/50; G06F 17/3017; G06F 17/30817; G06F 17/30038;
(Continued)

(56) References Cited

U.S. PATENT DOCUMENTS

| 5,339,393 A | 8/1994 | Duffy et al. |
| 5,388,197 A | 2/1995 | Rayner |

(Continued)

FOREIGN PATENT DOCUMENTS

| JP | 2003-283981 | 10/2003 |
| JP | 2004-080769 | 3/2004 |

(Continued)

OTHER PUBLICATIONS

Decision of Rejection for Japanese Patent Application No. JP 2014-094684, Feb. 1, 2016, 7 Pages.
(Continued)

*Primary Examiner* — Quoc A Tran
(74) *Attorney, Agent, or Firm* — Fenwick & West LLP

(57) ABSTRACT

A system and method is provided for managing and displaying annotations in online hosted videos. To determine related annotations associated with a video, a plurality of annotations for one or more intervals of the video are collected and organized into a plurality of groups. Each group includes annotations for intervals of the video that are similar to each other. A group having related annotations is identified, and an annotated clip of the video is formed based upon the intervals in the group. This process can be used to determine any number of groups in a given video having related annotations, forming the respective annotated intervals within a single video, and can also identify and organize annotated intervals within a large number of different videos.

19 Claims, 11 Drawing Sheets

Related U.S. Application Data

No. 12/033,817, filed on Feb. 19, 2008, now Pat. No. 8,112,702.

(51) Int. Cl.
  *G11B 27/10* (2006.01)
  *G11B 27/34* (2006.01)
  *G06F 17/30* (2006.01)
  *G06F 17/50* (2006.01)

(52) U.S. Cl.
  CPC ............ *G11B 27/105* (2013.01); *G11B 27/34* (2013.01); *G06F 17/30038* (2013.01); *G06F 17/30412* (2013.01); *G06F 17/30525* (2013.01); *G06F 17/30781* (2013.01); *G06F 17/30823* (2013.01); *G06F 17/30837* (2013.01); *G06F 17/50* (2013.01)

(58) Field of Classification Search
  CPC ............ G06F 17/3082; G06F 17/3882; G06F 17/30864; G06F 17/30823; G06F 17/30837; G06F 17/30781; G06F 17/30412; G06F 17/30525; G11B 27/105; G11B 27/34
  USPC ........ 715/230, 723–732; 386/52; 725/37–109
  See application file for complete search history.

(56) References Cited

U.S. PATENT DOCUMENTS

| | | |
|---|---|---|
| 5,414,806 A | 5/1995 | Richards |
| 5,530,861 A | 6/1996 | Diamant et al. |
| 5,600,775 A | 2/1997 | King et al. |
| 5,664,216 A | 9/1997 | Blumenau |
| 5,708,845 A | 1/1998 | Wistendahl et al. |
| 5,732,184 A | 3/1998 | Chao et al. |
| 5,812,642 A | 9/1998 | Leroy |
| 5,966,121 A | 10/1999 | Hubbell et al. |
| 6,006,241 A | 12/1999 | Purnaveja et al. |
| 6,144,375 A | 11/2000 | Jain |
| 6,295,092 B1 | 9/2001 | Hullinger et al. |
| 6,415,438 B1 | 7/2002 | Blackketter et al. |
| 6,570,587 B1 | 5/2003 | Efrat et al. |
| 6,774,908 B2 | 8/2004 | Bates et al. |
| 6,956,593 B1 | 10/2005 | Gupta et al. |
| 6,993,347 B2 | 1/2006 | Bodin et al. |
| 7,032,178 B1 | 4/2006 | McKnight et al. |
| 7,055,168 B1 | 5/2006 | Errico et al. |
| 7,131,059 B2 | 10/2006 | Obrador |
| 7,137,062 B2 | 11/2006 | Kaufman et al. |
| 7,149,755 B2 | 12/2006 | Obrador |
| 7,254,605 B1 | 8/2007 | Strum |
| 7,383,497 B2 | 6/2008 | Glenner et al. |
| 7,418,656 B1 | 8/2008 | Petersen |
| 7,559,017 B2 | 7/2009 | Datar et al. |
| 7,599,950 B2 | 10/2009 | Walther et al. |
| 7,616,946 B2 | 11/2009 | Park et al. |
| 7,636,883 B2 | 12/2009 | Albornoz et al. |
| 7,644,364 B2 | 1/2010 | Patten et al. |
| 7,724,277 B2 | 5/2010 | Shingu et al. |
| 7,761,436 B2 | 7/2010 | Norton et al. |
| 7,945,653 B2 | 5/2011 | Zuckerberg et al. |
| 8,132,200 B1 | 3/2012 | Karam et al. |
| 8,151,182 B2 | 4/2012 | Datar et al. |
| 8,181,201 B2 | 5/2012 | Goldenberg et al. |
| 8,202,167 B2 | 6/2012 | Ackley et al. |
| 8,209,223 B2 | 6/2012 | Fink et al. |
| 8,280,827 B2 | 10/2012 | Muller et al. |
| 8,392,834 B2 | 3/2013 | Obrador |
| 8,713,618 B1 | 4/2014 | Kuznetsov |
| 8,839,327 B2 | 9/2014 | Amento et al. |
| 2001/0023436 A1 | 9/2001 | Srinivasan et al. |
| 2002/0059218 A1 | 5/2002 | August et al. |
| 2002/0059342 A1* | 5/2002 | Gupta .................. G06F 17/241 715/233 |
| 2002/0059584 A1 | 5/2002 | Ferman et al. |
| 2002/0065678 A1 | 5/2002 | Peliotis et al. |
| 2002/0069218 A1* | 6/2002 | Sull .................. G06F 17/30796 715/202 |
| 2002/0078092 A1 | 6/2002 | Kim et al. |
| 2002/0120925 A1 | 8/2002 | Logan |
| 2002/0188630 A1 | 12/2002 | Davis et al. |
| 2003/0002851 A1 | 1/2003 | Hsiao et al. |
| 2003/0018668 A1 | 1/2003 | Britton et al. |
| 2003/0039469 A1 | 2/2003 | Kim |
| 2003/0068046 A1 | 4/2003 | Lindqvist et al. |
| 2003/0093790 A1 | 5/2003 | Logan et al. |
| 2003/0095720 A1 | 5/2003 | Chiu et al. |
| 2003/0107592 A1 | 6/2003 | Li et al. |
| 2003/0112276 A1 | 6/2003 | Lau et al. |
| 2003/0196164 A1 | 10/2003 | Gupta et al. |
| 2003/0231198 A1 | 12/2003 | Janevski |
| 2004/0021685 A1 | 2/2004 | Denoue et al. |
| 2004/0125133 A1 | 7/2004 | Pea et al. |
| 2004/0125148 A1* | 7/2004 | Pea .................. H04N 5/262 715/802 |
| 2004/0128308 A1 | 7/2004 | Obrador |
| 2004/0138946 A1 | 7/2004 | Stolze |
| 2004/0168118 A1 | 8/2004 | Wong et al. |
| 2004/0172593 A1 | 9/2004 | Wong et al. |
| 2004/0181545 A1 | 9/2004 | Deng et al. |
| 2004/0205482 A1 | 10/2004 | Basu et al. |
| 2005/0044254 A1 | 2/2005 | Smith |
| 2005/0081159 A1 | 4/2005 | Gupta et al. |
| 2005/0132401 A1 | 6/2005 | Boccon-Gibod et al. |
| 2005/0160113 A1 | 7/2005 | Sipusic et al. |
| 2005/0203876 A1 | 9/2005 | Cragun et al. |
| 2005/0203892 A1 | 9/2005 | Wesley et al. |
| 2005/0275716 A1 | 12/2005 | Shingu et al. |
| 2005/0289142 A1 | 12/2005 | Adams |
| 2005/0289469 A1 | 12/2005 | Chandler et al. |
| 2006/0041564 A1 | 2/2006 | Jain et al. |
| 2006/0053365 A1 | 3/2006 | Hollander et al. |
| 2006/0059120 A1 | 3/2006 | Xiong et al. |
| 2006/0064733 A1 | 3/2006 | Norton et al. |
| 2006/0087987 A1 | 4/2006 | Witt et al. |
| 2006/0101328 A1 | 5/2006 | Albornoz et al. |
| 2006/0161578 A1 | 7/2006 | Siegel et al. |
| 2006/0161838 A1 | 7/2006 | Nydam et al. |
| 2006/0218590 A1 | 9/2006 | White |
| 2006/0286536 A1 | 12/2006 | Mohler et al. |
| 2006/0294134 A1 | 12/2006 | Berkhim et al. |
| 2007/0002946 A1 | 1/2007 | Bouton et al. |
| 2007/0038610 A1 | 2/2007 | Omoigui |
| 2007/0099684 A1 | 5/2007 | Butterworth |
| 2007/0121144 A1 | 5/2007 | Kato |
| 2007/0162568 A1 | 7/2007 | Gupta et al. |
| 2007/0250901 A1 | 10/2007 | McIntire et al. |
| 2007/0256016 A1 | 11/2007 | Bedingfield |
| 2007/0266304 A1 | 11/2007 | Fletcher et al. |
| 2007/0271331 A1 | 11/2007 | Muth |
| 2008/0005064 A1 | 1/2008 | Sarukkai |
| 2008/0028294 A1 | 1/2008 | Sell et al. |
| 2008/0028323 A1* | 1/2008 | Rosen .................. G06Q 10/10 715/752 |
| 2008/0086742 A1 | 4/2008 | Aldrey et al. |
| 2008/0091723 A1 | 4/2008 | Zuckerberg et al. |
| 2008/0092168 A1 | 4/2008 | Logan et al. |
| 2008/0168055 A1 | 7/2008 | Rinearson et al. |
| 2008/0168070 A1 | 7/2008 | Naphade et al. |
| 2008/0168073 A1 | 7/2008 | Siegel et al. |
| 2008/0225153 A1 | 9/2008 | Fagans |
| 2008/0250331 A1 | 10/2008 | Tulshibagwale |
| 2009/0007200 A1 | 1/2009 | Amento et al. |
| 2009/0076843 A1 | 3/2009 | Graff et al. |
| 2009/0087161 A1 | 4/2009 | Roberts et al. |
| 2009/0094520 A1 | 4/2009 | Kulas |
| 2009/0150947 A1 | 6/2009 | Soderstrom |
| 2009/0172745 A1 | 7/2009 | Horozov et al. |
| 2009/0199251 A1 | 8/2009 | Badoiu et al. |
| 2009/0204882 A1 | 8/2009 | Hollander et al. |
| 2009/0210779 A1 | 8/2009 | Badoiu et al. |
| 2009/0249185 A1 | 10/2009 | Datar et al. |
| 2009/0276805 A1 | 11/2009 | Andrews et al. |

(56) References Cited

U.S. PATENT DOCUMENTS

| | | |
|---|---|---|
| 2009/0297118 A1 | 12/2009 | Fink et al. |
| 2009/0300475 A1 | 12/2009 | Fink et al. |
| 2010/0169927 A1 | 7/2010 | Yamaoka et al. |
| 2010/0287236 A1 | 11/2010 | Amento et al. |
| 2013/0238995 A1 | 9/2013 | Polack |
| 2013/0263002 A1 | 10/2013 | Park |
| 2013/0290996 A1 | 10/2013 | Davis |
| 2014/0101691 A1 | 4/2014 | Sinha et al. |

FOREIGN PATENT DOCUMENTS

| | | |
|---|---|---|
| JP | 2005-530296 | 10/2005 |
| JP | 2006-157689 | 6/2006 |
| JP | 2006-157692 | 6/2006 |
| JP | 2006155384 A | 6/2006 |
| JP | 2007-142750 | 6/2007 |
| JP | 2007-151057 | 6/2007 |
| JP | 2007-274090 | 10/2007 |
| JP | 2007/529822 | 10/2007 |
| JP | 2007-310833 | 11/2007 |
| JP | 2007/317123 | 12/2007 |
| KR | 2007-0004153 A1 | 1/2007 |
| WO | WO 03/019418 A1 | 3/2003 |
| WO | WO 2007/082169 A2 | 7/2007 |
| WO | WO 2007/135688 A2 | 11/2007 |

OTHER PUBLICATIONS

Communication pursuant to Article 91(3) EPC for European Patent Application No. 09711777.4, Aug. 18, 2015, 8 Pages.

Office Action for U.S. Appl. No. 13/341,131, filed Nov. 19, 2015, 29 Pages.

Office Action for Chinese Patent Application No. 200780050525.4, Oct. 26, 2015, 6 Pages.

$2^{nd}$ Office Action for CN Application No. 200780050525.4, Sep. 16, 2014, 21 pages.

Summons to attend oral proceedings pursuant to Rule 115(1) EPC for EP Application No. 09709327.2, Sep. 25, 2014, 9 pages.

United States Office Action for U.S. Appl. No. 13/341,131, Mar. 27, 2015, 29 pages.

Office Action for KR Application No. 10-2010-7020965, Feb. 26, 2015, 11 pages, (with concise statement).

$3^{rd}$ Office Action for Chinese Patent Application No. CN 200780050525.4, Apr. 30, 2015, 8 Pages.

Communication pursuant to Article 94(3) EPC for European Patent Application No. EP07865849.9, Apr. 28, 2015, 6 pages.

Extended European Search Report for European Patent Application No. EP09758919.6, Feb. 10, 2015, 7 Pages.

Japanese Office Action for JP Application No. P2014-094684, Mar. 17, 2015, 9 Pages.

Screenshot for Zentation.com, 1 page, [online] [Retrieved on Jun. 26, 2009] Retrieved from the internet <URL:http://www.zentation.com/>.

Screenshot for Zentation.com, 1 page, [online] [Retrieved on Jun. 26, 2009] Retrieved from the internet <URL:http://www.zentation.com/viewer/index.phppasscode=epbcSNExIQr>.

Screenshot for Zentation.com, 1 page, [online] [Retrieved on Jun. 26, 2009] Retrieved from the internet <URL:http://www.zentation.com/viewer/setup.php?passcode=De2cwpjHsd>.

"New Feature: Link within a Video," Google Video Blog, Jul. 19, 2006, pp. 1-5, [online] [Retrieved on Jul. 18, 2008] Retrieved from the internet <URL:http://googlevideo.blogspot.com/2006/07/new-feature-link-within-video_19.html>.

"New commenting and stats features," Google Video Blog, Nov. 14, 2006, pp. 1-5, [online] [Retrieved on Jul. 18, 2008] Retrieved from the internet <URL:http://googlevideo.blogspot.com/2006/11/new-commenting-and-stats-features.html>.

"Online Media Bookmark Manager," Media X, pp. 1-2, [online] [Retrieved on Jul. 18, 2008] Retrieved from the internet <URL:http://mediax.stanford.edu/documents/bookmark.pdf>.

Screenshot of Veeple Labs—Interactive Video, 1 page, [online] [Retrieved on Jun. 9, 2008] Retrieved from the internet <URL:http://www.veeple.com/>.

Screenshot of "Interactive Video Demo—Check out the Yelp / AdSense demo," Ooyala, Inc. 2009, 1 page, [online] [Retrieved on Apr. 23, 2009] Can be retrieved from the internet <URL:http://www.ooyala.com/products/ivideo>.

Gonzalez, N., "Video Ads: Every Startup Has a Different Solution," TechCrunch, Jul. 6, 2007, 7 Pages, [online] [Retrieved on Apr. 20, 2009] Retrieved from the internet <URL:http://www.techcrunch.com/2007/07/06/video-ads-somebody-needs-to-solve-this-problem/>.

Good, R., "Online Video Publishing Gets Into The Conversation: Click.TV," Robin Good, What Communication Experts Need to Know, Apr. 18, 2006, 10 pages, [online] [retrieved on Jan. 16, 2007] Retrieved from the Internet: <URL: http://www.masternewmedia.org/news/2006/04/18/online_video_publishing_gets_into.html>.

Mikolajczyk, K. et al., "A Performance Evaluation of Local Descriptors", IEEE Transactions on Pattern Analysis and Machine Intelligence, Oct. 2005, vol. 27, No. 10, pp. 1615-1630, 16 pages.

Moenne-Loccoz, N., et al., "Managing Video Collections at Large," CUDB '04: Proceedings of the $1^{st}$ International Workshop on Computer Vision Meets Database, Jun. 2004, pp. 59-66.

Tjondronegoro, D., et al., "Content-Based Video Indexing for Sports Applications Using Integrated Multi-Modal Approach," Multimedia '05: Proceedings of the $13^{th}$ Annual ACM International Conference on Multimedia, Nov. 2005, p. 1035-1036.

Zentation.com [online] [Retrieved on Jun. 26, 2009] Retrieved from the internet <URL:http://www.zentation.com/>.

Zentation.com [online] [Retrieved on Jun. 26, 2009] Retrieved from the internet <URL:http://www.zentation.com/viewer/index.phppasscode=epbcSNExIQr>.

Zentation.com [online] [Retrieved on Jun. 26, 2009] Retrieved from the internet <URL:http://www.zentation.com/viewer/setup.php?passcode=De2cwpjHsd>.

"New Feature: Link within a Video," Google Video Blog, Jul. 19, 2006, [online] [Retrieved on Jul. 18, 2008] Retrieved from the internet <URL:http://googlevideo.blogspot.com/2006/07/new-feature-link-within-video_19.html>.

"New commenting and stats features," Google Video Blog, Nov. 14, 2006, [online] [Retrieved on Jul. 18, 2008] Retrieved from the internet <URL:http://googlevideo.blogspot.com/2006/11/new-commenting-and-stats-features.html>.

"Online Media Bookmark Manager," Media X, Date Unknown, [online] [Retrieved on Jul. 18, 2008] Retrieved from the internet <URL:http://mediax.stanford.edu/documents/bookmark.pdf>.

"Ticket #3504 (new enhancement)," Participatory Culture Foundation, Software Development, Aug. 14, 2006, 1 page, [online] [retrieved on Jan. 16, 2007] Retrieved from the Internet: <URL: https://develop.participatoryculture.org/trac/democracy/ticket/3504>.

"Video Marketing, Video Editing & Hosting, Interactive Video," Veeple.com, 2009, 1 page, [online] [Retrieved on Apr. 20, 2009] Retrieved from the internet <URL:http://www.veeple.com/interactivity.php>.

"More on Mojiti," bavatuesdays.com, Mar. 23, 2007, 4 pages, [online] [Retrieved on Apr. 20, 2009] Retrieved from the internet <URL:http://bavatuesdays.com/more-on-mojiti/>.

"BubblePLY," PLYmedia Inc. 2008, 1 page, [online] [Retrieved on Apr. 20, 2009] Retrieved from the internet URL:http://www.plymedia.com/products/bubbleply/bubbleply.aspx>.

"Ooyala—Interactive Video Advertising," Ooyala, Inc. 2009, 1 page, [online] [Retrieved on Apr. 20, 2009] Retrieved from the internet <URL:http://www.ooyala.com/products/ivideo>.

MirriAd, 2008, 1 page, [online] [Retrieved on Apr. 20, 2009] Retrieved from the internet <URL:http://www.mirriad.com>.

Screenshot of "Remixer", YouTube.com, May 2007 to Feb. 2008, 1 page.

Screenshot of Veeple Labs—Interactive Video, [online] [Retrieved on Jun. 9, 2008] Retrieved from the internet <URL:http://www.veeple.com/>.

(56) References Cited

OTHER PUBLICATIONS

Screenshot of "Interactive Video Demo—Check out the Yelp / AdSense demo," Ooyala, Inc. 2009, [online] [Retrieved on Apr. 23, 2009] Can be retrieved from the internet <URL:http://www.ooyala.com/products/ivideo>.
PCT International Search Report and Written Opinion, PCT/US2009/034422, Oct. 6, 2009, 12 Pages.
PCT International Search Report and Written Opinion, PCT/US2007/088067, Jul. 21, 2008, 13 pages.
PCT International Search Report and Written Opinion, PCT/US2009/042919, Jun. 17, 2009, 8 pages.
PCT International Search Report and Written Opinion, PCT/US2009/033475, Aug. 20, 2009, 7 Pages.
U.S. Appl. No. 61/097,167, filed Sep. 15, 2008, 49 Pages.
U.S. Appl. No. 60/756,787, filed Jan. 6, 2006, 19 pages.
U.S. Appl. No. 12/411,162, filed Mar. 25, 2009, 38 Pages.
Caspi, Y., et al., "Sharing Video Annotations," International Conference on Image Processing, 2004, pp. 2227-2230.
Gordon, A., "Using Annotated Video as an Information Retrieval Interface," IUI ACM, 2000, pp. 133-140.
Farshid Arman et al., *Image processing on encoded video sequences*, Multimedia Systems, Mar. 1994, pp. 211-219, vol. 1, No. 5.
Ralph M. Ford et al., *Metrics for shot boundary detection in digital video sequences*, Multimedia Systems, Jan. 2000, pp. 37-46, vol. 8.
Miyamori, H., et al., "Gernation of Views of TV Content Using TV Viewers' Perspectives Expressed in Live Chats on the Web," Proceedings of the 13th Annual ACM International Conference on Multimedia, Nov. 6, 2005, pp. 853-861.
M.R. Naphade et al., *A High-Performance Shot Boundary Detection Algorithm Using Multiple Cues*, Oct. 1998 International Conference on Image Processing, pp. 884-887, vol. 1.
Ramin Zabih et al., *A Feature-Based Algorithm for Detecting and Classifying Scene Breaks*, Proceedings of the third ACM International Conference on Multimedia, 1995, pp. 189-200.
Schroeter, R., et al., "Vannotea- A Collaborative Video Indexing, Annotation and Discussion System for Broadband Networks," Knowledge Capture, 2006, pp. 1-8.
First Examination Report for Indian Patent Application No. 1191/MUMNP/2009, Mar. 18, 2014, 2 Pages.
European Extended Search Report, European Application No. 09709327.2, Sep. 21, 2012, 7 pages.
Communication Pursuant to Article 94(3) EPC for European Patent Application No. EP 09709327.2, Jan. 10, 2014, 6 Pages.
Supplementary European Search Report for European Patent Application No. EP 07865849.9, May 18, 2012, 7 Pages.
Extended European Search Report for European Patent Application No. EP 09711777.4, Dec. 12, 2012, 8 Pages.
Chinese First Office Action, Chinese Application No. 200910206036.4, Sep. 18, 2012, 19 pages.
Notification of Second Board Opinion for Chinese Patent Application No. 200780050525.4, Dec. 26, 2013, 5 Pages.
Notification of Reexamination Board Opinion for Chinese Patent Application No. 200780050525.4, Jun. 14, 2013, 11 Pages.
Chinese Second Office Action, Chinese Application No. 200980108230.7, Aug. 13, 2012, 11 pages.
First Office Action for Chinese Patent Application No. CN 200980108230.7, Feb. 28, 2012, 11 Pages.
Rejection Decision for Chinese Patent Application No. CN 200780050525.4, Jan. 18, 2012, 23 Pages.
Office Action for Canadian Patent Application No. CA-2,672,757, Mar. 21, 2013, 5 Pages.
Office Action for Canadian Patent Application No. CA 2,726,777, Nov. 26, 2012, 3 Pages.
Examiner's first report on Australian Patent Application No. AU 2010249316, Mailed Jun. 20, 2011, 3 Pages.
Office Action for Japanese Patent Application No. P2010-546967, Apr. 23, 2013, 5 Pages.
Korean Intellectual Property Office Notice of Preliminary Rejection, Korean Patent Application No. 10-2009-7015068, Feb. 5, 2010, 12 pages.
Korean Intellectual Property Office Notice of Preliminary Rejection, Korean Patent Application No. 10-2009-7015068, Oct. 5, 2009, 4 pages.
Office Action for U.S. Appl. No. 12/033,817, May 12, 2011, 30 Pages.
Office Action for U.S. Appl. No. 13/341,131, Dec. 5, 2013, 21 Pages.
Office Action for U.S. Appl. No. 13/341,131, Apr. 11, 2013, 21 Pages.

* cited by examiner

ANNOTATING VIDEO INTERVALS

RELATED APPLICATIONS

This application is a continuation of U.S. patent application Ser. No. 13/341,131, filed on Dec. 30, 2011, which is a continuation of U.S. patent application Ser. No. 12/033,817, filed on Feb. 19, 2008, each of which is incorporated by reference herein in its entirety.

TECHNICAL FIELD

The disclosed embodiments relate generally to the management and display of annotations for video intervals.

BACKGROUND

The proliferation of video sharing through video hosting websites provides numerous opportunities to collaborate and experience videos in online communities. Video hosting websites allow users to upload, view, comment on and rate videos. Users browsing a video hosting website can locate videos of interest by, for example, searching for videos, browsing directories, or sorting by ratings.

Comments provide a way to complement video with useful information. Comments can be of various data types, including text, audio, graphics, or other forms. However, comments have been used to provide information about an entire video, rather than a specific portion. If a user wants to direct others to a specific portion of the video, the user has to enter the time offset for that point in the comments, such as "see stunt at 1:48." Other users would then have to traverse through the subject video to the 1 minute, 48 second mark and then view from there to understand the comment.

In addition, the content contained in comments may be unreliable. Difficulty arises in ascertaining the trustworthiness of the author of the comments. Also, a large number of comments may hinder understanding of the information to be conveyed through such comments. Moreover, it is difficult to know which comments associated with a video are related. For example, unless all of the comments are associated with the identical time-elapsed place in the video, there is uncertainty as to whether the comments refer to the same portion of a video.

Further, users may want to create their own comments to highlight certain aspects of video. Personalized comments may raise security concerns, and challenges in determining how and with whom such bookmarks should be shared. In addition, if personalized comments are examined in isolation, they provide only minimal meaning to related groups of users that also have comments. Such personalized comments are also difficult to retrieve and locate by both the user and those persons with whom the comments have been shared.

SUMMARY

The present invention includes systems and methods for managing annotations in videos in a video hosting website. Users submit annotations of intervals within various videos stored in a video hosting website. For example, annotations can be associated with spatial portions of a video frame, with a particular moment in a video, or a scene of a video. For any given video, there may be a large number of annotations, each associated with some interval of video. These intervals may overlap. Thus it is desirable to organize the annotations for one or more intervals of the video into groups, and then determine a clip of the video to associate with the group of annotations. Each group includes annotations for intervals of the video, where the intervals are similar to each other. A group having related annotations is identified, and an annotated clip of the video is formed based upon the intervals in the group. This process can be expanded to determine any number of groups in a given video having related annotations as desired, forming the respective annotated intervals within a single video, and can also identify and organize annotated intervals within a large number of different videos.

A synoptic annotation can be determined based on the related annotations. For instance, a synoptic annotation can include a summary of the content of related annotations or excerpts from the related annotations.

Groups can be formed in a variety of ways. For example, annotations can be clustered into groups based on a timestamp associated with each annotation. Also, annotations can be clustered based on the start times and the end times of the intervals associated with the annotations. Groups can be associated with identified scenes or features in the video. In addition, groups can be formed based on a determination of the maximum number of indications of annotated clips that can be visually distinguished on a timeline corresponding to the video. The amount of time between intervals can also be taken into account in forming the groups.

The content of the annotations can be considered to determine a group having related annotations; for example, a group may be formed from annotations all having one or more keywords in common. Annotations can also be examined to identify annotations containing a search query term in one or many videos.

A computer system manages annotations associated with a video via a number of server modules. An extraction module extracts a plurality of annotations associated with one or more intervals of the video. The grouping module forms a plurality of groups, each including annotations for similar intervals of the video. The annotation determination module determines a group having related annotations, and the annotated clip generation module forms an annotated clip of the video based upon the intervals in the group.

The features and advantages described in this summary and the following detailed description are not all-inclusive. Many additional features and advantages will be apparent to one of ordinary skill in the art in view of the drawings, specification, and claims presented herein.

The figures depict various embodiments of the present invention for purposes of illustration only. One skilled in the art will readily recognize from the following discussion that alternative embodiments of the structures and methods illustrated herein may be employed without departing from the principles of the invention described herein.

DESCRIPTION OF EMBODIMENTS

Figure 1:
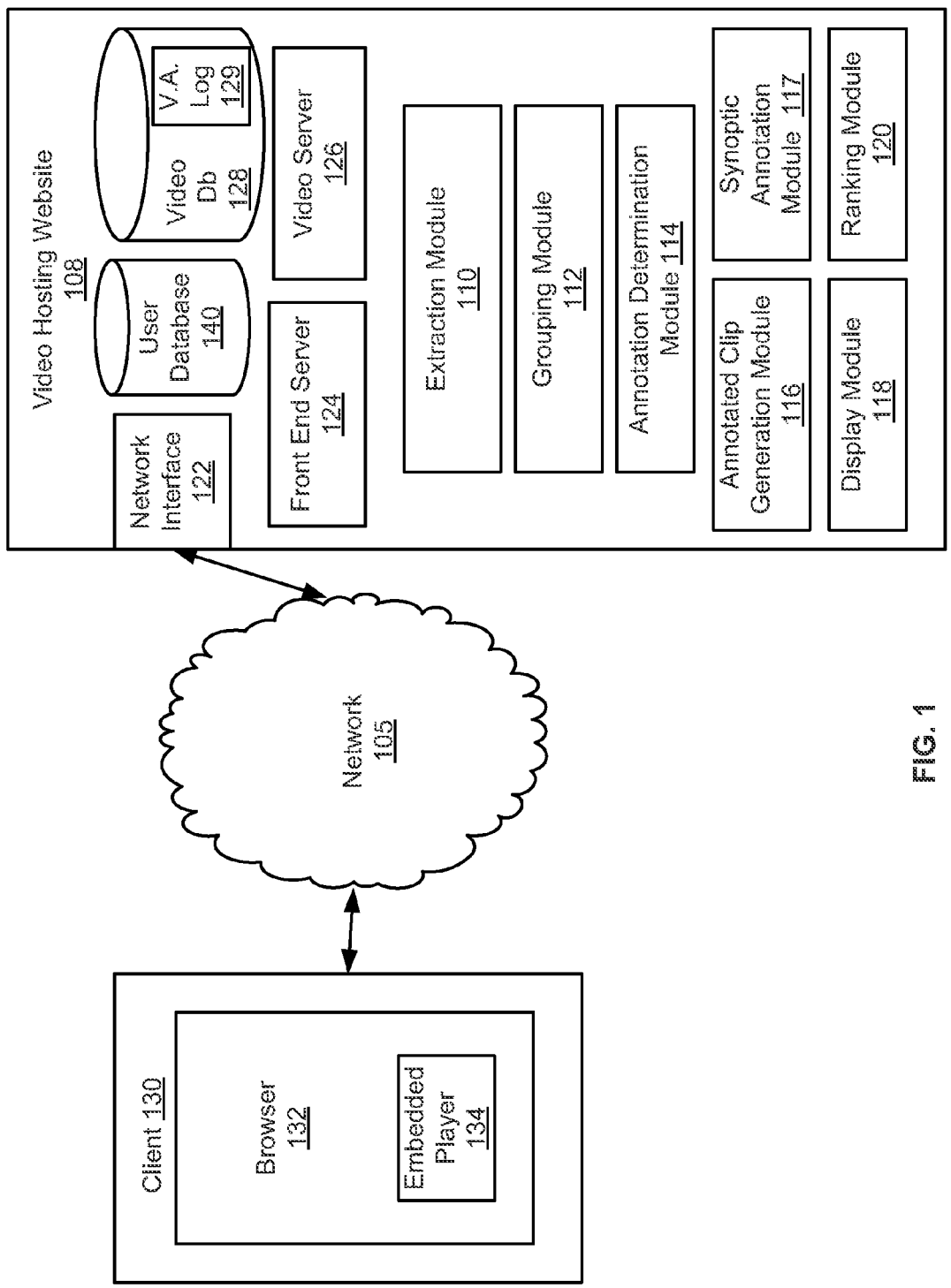
FIG. 1 is a block diagram of a system architecture for managing annotations in online hosted videos in accordance with one embodiment of the present invention.

FIG. 1 is a block diagram of a system architecture in accordance with one embodiment. As illustrated in FIG. 1, a video hosting website 108 includes a front end server 124, a video server 126, a network interface 122, an extraction module 110, a grouping module 112, an annotation determination module 114, a clip generation module 116, a synoptic annotation module 117, a display module 118, a ranking module 120, a video database 128, a video access log 129, and a user database 140. Other conventional features, such as firewalls, load balancers, application servers, failover servers, site management tools, and so forth are not shown so as to more clearly illustrate the features of the system. Examples of a suitable website 108 for implementation of the system include the YouTube™ and Google Video™ websites; other video hosting sites are known as well, and can be adapted to operate according to the teachings disclosed herein. It will be understood that the term "website" represents any system and method of providing content and is not intended to be limited to systems that support content provided via the Internet or the HTTP protocol. The various servers are conventionally implemented, whether as a single piece of software or hardware or as multiple pieces of software or hardware and can couple to the network 105 via the network interface 122. In general, functions described in one embodiment as being performed on the server side can also be performed on the client side in other embodiments if appropriate.

A client 130 executes a browser 132, and connects to the front end server 124 via a network 105, which is typically the Internet, but may also be any network, including but not limited to a LAN, a MAN, a WAN, a mobile, wired or wireless network, a private network, or a virtual private network. While only a single client 130 and browser 132 are shown, it is understood that very large numbers (e.g., millions) of clients are supported and can be in communication with the website 108 at any time. The client 130 may include a variety of different computing devices. Examples of client devices 130 are personal computers, digital assistants, personal digital assistants, cellular phones, mobile phones, smart phones or laptop computers. As will be obvious to one of ordinary skill in the art, the present invention is not limited to the devices listed above.

A user views, authors, and edits annotations using a client 130. An annotation includes annotation content, which is any data which can usefully supplement a media file. For example, annotation content can include an audio or textual commentary, metadata, translation, advertisement or summary, rating on a predetermined scale (1-5 stars), or a command for how the media file should be displayed. An annotation can optionally include a spatial definition, which specifies the area of the frame with which an annotation is associated. An annotation can also include video content. The clients 130 include software and hardware for displaying video.

For example, a client 130 can be implemented as a television, a personal computer, a digital video recorder (DVR), a personal digital assistant (PDA), a cellular telephone, or another device having or connected to a display device; software includes any video player adapted to decode video files, such as MPEG-2, MPEG-4, QuickTime, VCD, or any other current or future video format. Other examples of clients will be apparent to one of skill in the art without departing from the scope of the present invention. Examples of a graphical user interface used by the client 130 according to one embodiment is described herein with references to FIGS. 3, 4, 7(a) and 7(b).

In some embodiments, the browser 132 includes an embedded video player 134 such as, for example, the Flash™ player from Adobe Systems, Inc. or any other player adapted for the video file formats used in the video hosting website 108. A user can access a video from the video hosting website 108 by browsing a catalog of videos, conducting searches on keywords, reviewing play lists from other users or the system administrator (e.g., collections of videos forming channels), or viewing videos associated with particular user group (e.g., communities).

Video server 126 receives uploaded media content from content providers and allows content to be viewed by client 130. Content may be uploaded to video server 126 via the Internet from a personal computer, through a cellular network from a telephone or PDA, or by other means for transferring data over network 105 known to those of ordinary skill in the art. Content may be downloaded from video server 126 in a similar manner; in one embodiment media content is provided as a file download to a client 130; in an alternative embodiment, media content is streamed to client 130. The means by which media content is received by video server 126 need not match the means by which it is delivered to client 130. For example, a content provider may upload a video via a browser on a personal computer, whereas client 130 may view that video as a stream sent to a PDA. Note also that video server 126 may itself serve as the content provider.

Users of clients 130 can also search for videos based on keywords, tags or other metadata. These requests are received as queries by the front end server 124 and provided to the video server 126, which is responsible for searching the video database 128 for videos that satisfy the user queries. The video server 126 supports searching on any fielded data for a video, including its title, description, tags, author, category and so forth. Responsive to a request from a client 130 for an annotation associated with a particular media file, the video server 126 sends one or more annotations associated with the media file to the client 130 through the network 105. Responsive to a submission by the client 130 of one or more annotations associated with a media file, the video server 126 stores the one or more annotations in association with the media file in user database 140.

Information about received annotations is stored in the user database 140. The user database 140 is responsible for maintaining a record of all users viewing videos on the website. Each individual user is assigned a user ID. The user ID can be based on any identifying information, such as the user's IP address, user name, or the like. The user database may also contain information about the reputation of the user in both the video context, as well as through other applications, such as the use of email or text messaging.

Users of the clients 130 and browser 132 can upload content to the video hosting website 108 via network 105. The uploaded content can include, for example, video, audio or a combination of video and audio. The uploaded content is processed and stored in the video database 128. This processing can include format conversion (transcoding), compression, metadata tagging, and other data processing. An uploaded content file is associated with the uploading user, and so the user's account record is updated in the user database 140 as needed.

For purposes of convenience and the description of one embodiment, the uploaded content will be referred to a "videos", "video files", or "video items", but no limitation on the types of content that can be uploaded are intended by this terminology. Each uploaded video is assigned a video identifier when it is processed.

The video database 128 is used to store the received videos. The video database 128 stores video content and associated metadata, provided by their respective content owners. The video files have metadata associated with each file such as a video ID, artist, video title, label, genre, and time length.

A video access log 129 within video database 128 stores each instance of video access. Annotations can be submitted by clicking on an indicator or on a portion of a time line associated with the video. Users may also click and drag on the time line to specify an annotation for a longer interval of video. Users may also submit annotations via a digital video recorder (DVR) or with a device providing similar functionality, such as by using a remote control configured to allow entry of annotations through a user interface associated with the device. Each entry in the access log 129 identifies a video being accessed, a time of access, an IP address of the user, a user ID if available, cookies, search queries, data identifying the type of interaction with the video, and the time of every interaction with the video. Interaction types can include any user interactions in the user interface of the website 108, such as playing, pausing, rewinding, forwarding and submitting annotations or ratings for a video.

Figure 3:
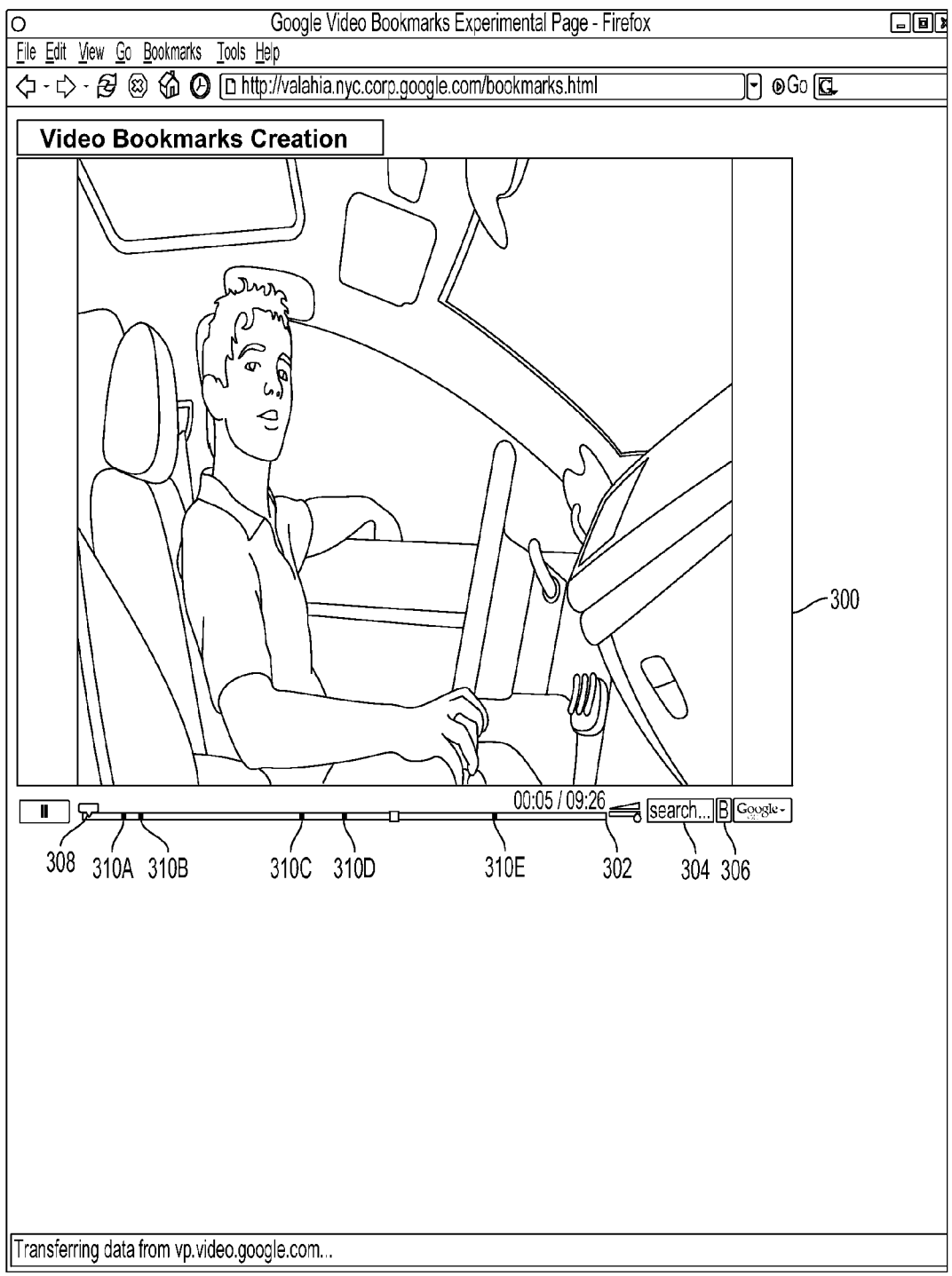
FIG. 3 illustrates a user interface for entering annotations for intervals of video in accordance with one embodiment of the present invention.

Turning now to FIG. 3, an example of a web page providing a user interface for entering annotations and viewing media content from video server 126 by client 130 is depicted. The web page includes a video 300, and may include information about the video, such as the name or user ID of the content provider, the date the video was uploaded, etc. (not shown). The web page also contains a timeline 302, which corresponds to the video 300. The marker 308 on timeline 302 indicates the concurrent position of the video 300 being displayed. The web page also has a search box 304 to allow for searching the content of the annotations.

Users can submit an annotation for an interval of video in various ways. For example, users can click the "B" button 306 when they view an interval of video on which they wish to provide an annotation. Users can also click and hold the "B" button 306 to indicate an interval longer than one click. As another option, users can click the "B" button 306 to mark the start time of an interval and click the "B" button 306 again to indicate the end of an interval for which they are providing an annotation. The depiction in FIG. 3 is one example of a user interface for receiving annotations for video intervals.

Figure 4:
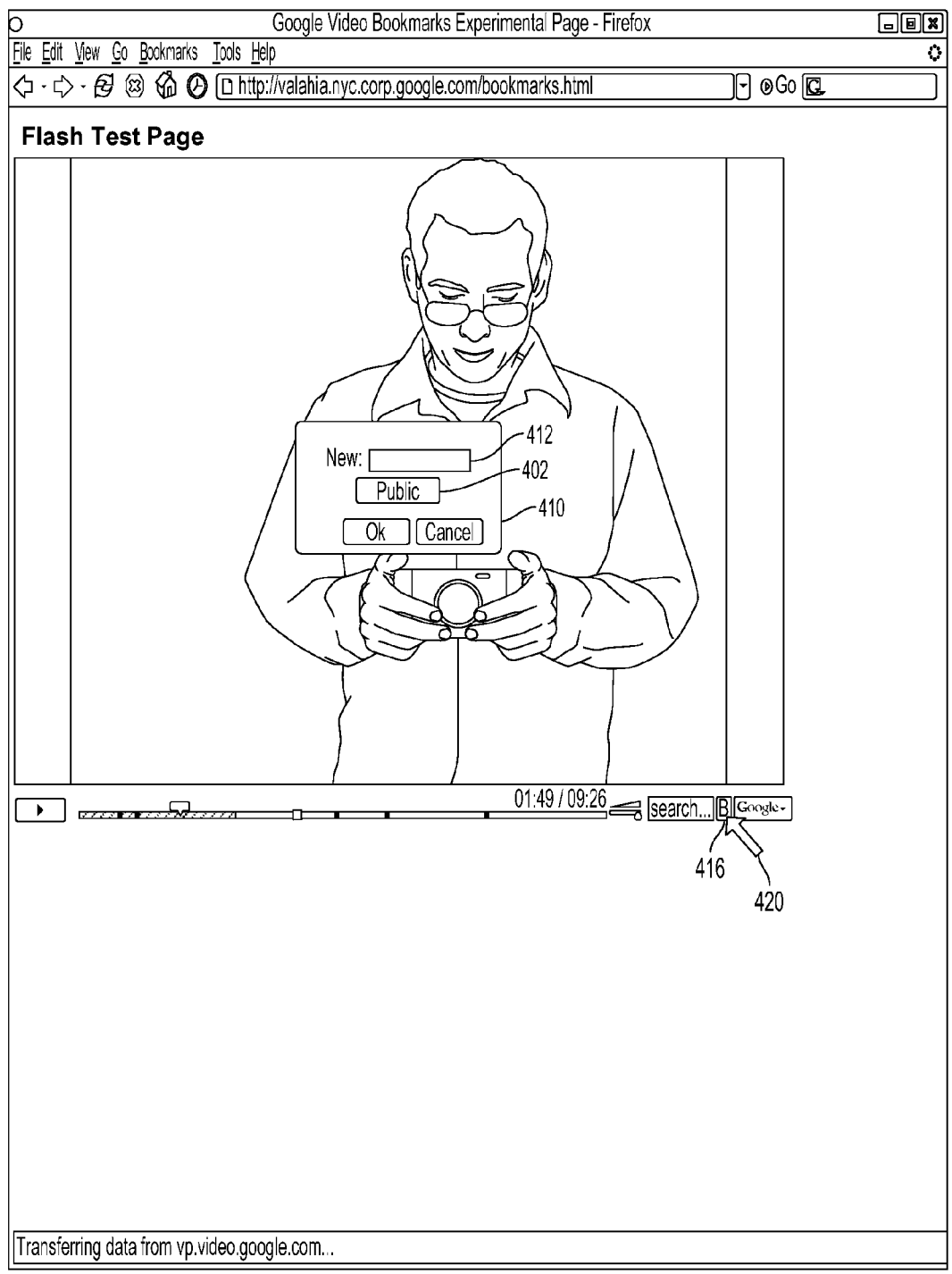
FIG. 4 illustrates a user interface for entering annotations for intervals of video in accordance with one embodiment of the present invention.

Another example of a user interface for receiving annotations for video intervals is depicted in FIG. 4. By positioning cursor 420 over the "B" button 416, pop-up window 410 is displayed. This window allows a user to enter text in textbox 412 to create an annotation. In addition, the user may click on the "Public" button 402 to indicate that the entered text may be searched and viewed publicly. As will be discussed in more detail with reference to FIG. 6, annotations can also be associated with spatial locations in a video frame.

Figure 5:
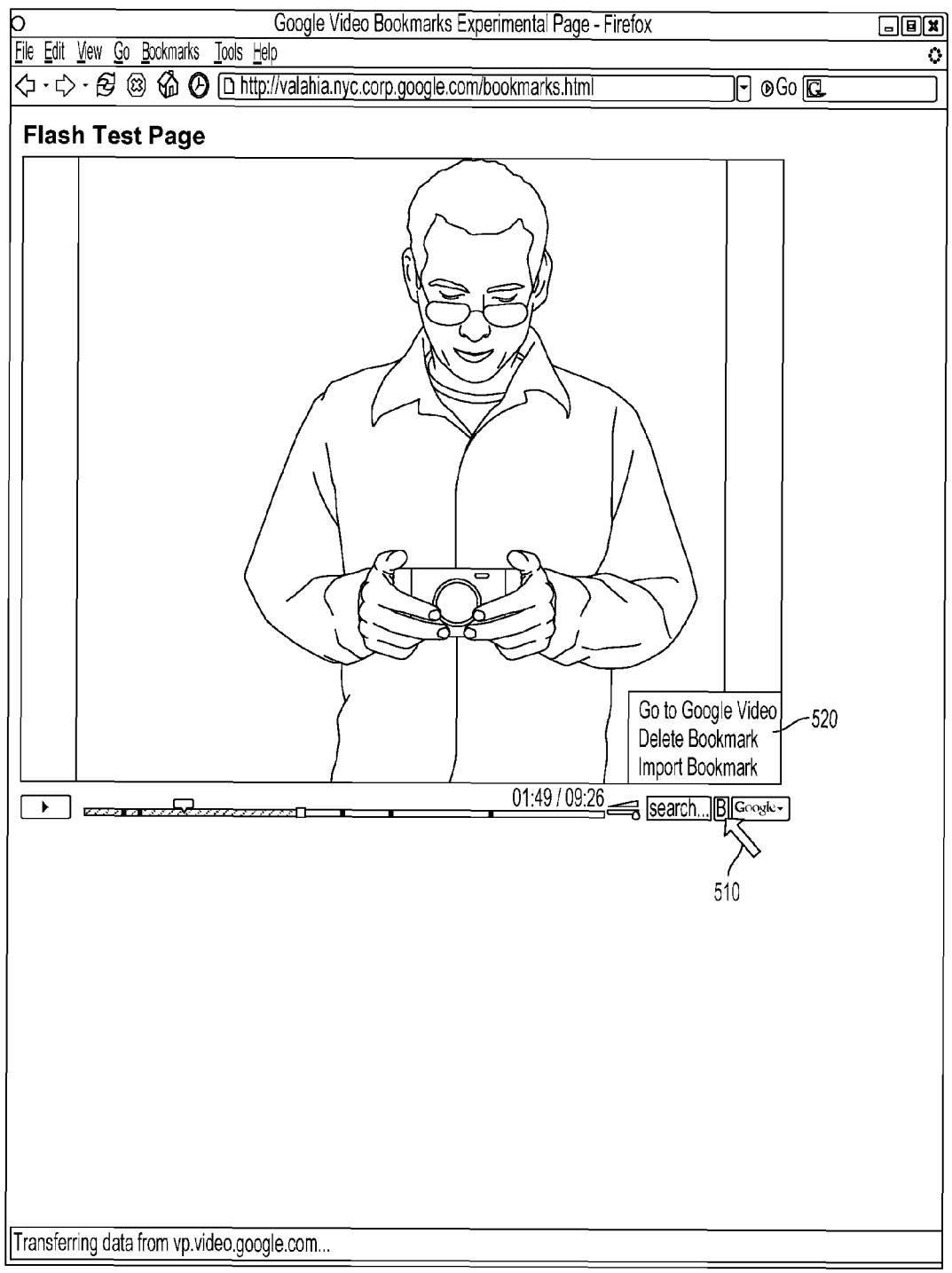
FIG. 5 illustrates a user interface for managing annotations for intervals of video in accordance with one embodiment of the present invention.

FIG. 5 illustrates another user interface for managing annotations for intervals of video in accordance with one embodiment of the present invention. After cursor 510 is used to indicate selection of the "B" button, a window 520 is displayed, permitting a user to delete or import a bookmark annotation. One of ordinary skill in the art would recognize that other user interfaces could be used in accordance with the present invention.

Figure 2:
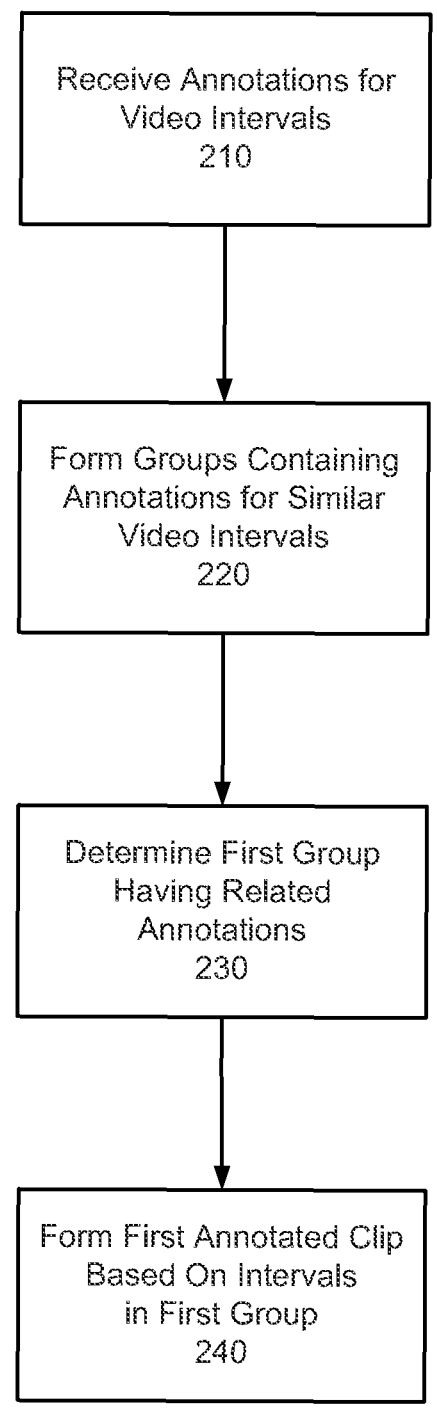
FIG. 2 illustrates a method for managing annotations in online hosted videos in accordance with an embodiment of the present invention.

The modules 110-120 of FIG. 1 can be used to carry out the method depicted in FIG. 2. Extraction module 110 extracts received annotation events 210 from the video access log 129. An interval may be a specific moment in a video (such as 2 minutes, 3 seconds), or it may be a range of time (from 2 minutes, 3 seconds until 2 minutes, 45 seconds). The user information associated with the annotations can include, for example, a time the annotation was received, a timestamp associated with each annotation, a start time and an end time of the intervals associated with the annotations, and a reputation score for the user submitting the annotation. The user information can be stored in user database 140. Extraction module 110 extracts annotations and sorts them by video ID and time stamp to form annotation blocks. Each block of annotations is associated with a video, and sorted by time stamp.

The grouping module 112 forms 220 groups containing annotations for similar intervals of the video. The groups of annotations within a block of annotations may be formed by a variety of methods. For example, the grouping module 112 forms a plurality of groups by clustering annotations based on a timestamp associated with each annotation. If the annotations have timestamps within a specified time limit of each other, the grouping module determines that they relate to similar intervals of video and are clustered. For example, annotations that have a timestamp within 5 seconds of each other are determined to refer to similar intervals. For example, some users may timestamp an action at its beginning, some at its climax and some immediately after it finishes. Using this technique, these annotations would be grouped together.

In another embodiment, the annotations are clustered based on the start times and the end times of the intervals. For example, if there is sufficient overlap (e.g. 25%) between intervals (bounded by the start times and the end times of the intervals with which the annotations are associated), the grouping module 112 determines that the annotations relate to similar intervals of the video. This allows for annotations to be grouped even where the intervals to which they are associated are not identical.

Various methods for clustering the annotations may be used. Some examples of well-known clustering methods include k-means or k-center clustering.

In another embodiment, the grouping module 112 forms 220 groups by determining an amount of time between the intervals with which the annotations are associated. If a sufficient amount of time exists between intervals (for example, 30 seconds), grouping module 112 forms a new group for the annotations associated with the intervals. For instance, if only 5 seconds exists between two intervals in question in a 10 minute video, grouping module could decline to form new group for the intervals.

Another way grouping module 112 forms 220 groups is by identifying a plurality of scenes or features in a video and associating each group with one or more scenes or features.

A feature is a succinct representation of the content of one or more frames of video that are similar. For example, the grouping module 112 may group the frames into logical units, such as scenes or shots. The grouping module 112 may use scene detection algorithms to group the frames automatically. One scene detection algorithm is described in Naphade, M. R., et al., "A High-Performance Shot Boundary Detection Algorithm Using Multiple Cues", 1998 International Conference on Image Processing (Oct. 4-7, 1998), vol. 1, pp. 884-887, which is incorporated by reference herein, though there are many scene detection algorithms known in the art that can be used equally as well.

Thus, the grouping module 112 can compute one feature set for all frames that belong to the same scene. The feature can be, for example, a description of a characteristic in the time, spatial, or frequency domains. For example, annotations can be associated with a specific frame, and can describe that frame by its time, position, and frequency domain characteristics. The grouping module 112 can use any technique for determining features of video, such as those described in Zabih, R., Miller, J., and Mai, K., "Feature-Based Algorithms for Detecting and Classifying Scene Breaks", Proc. ACM Multimedia 95, San Francisco, Calif. (November 1993), pp. 189-200; Arman, F., Hsu, A., and Chiu, M-Y., "Image Processing on Encoded Video Sequences", Multimedia Systems (1994), vol. 1, no. 5, pp. 211-219; Ford, R. M., et al., "Metrics for Shot Boundary Detection in Digital Video Sequences", Multimedia Systems (2000), vol. 8, pp. 37-46, all of the foregoing being incorporated by reference herein. One of ordinary skill in the art would recognize various techniques for determining features of video.

In another embodiment, the grouping module 112 forms 220 groups by determining a maximum number of indications of annotated clips that can be visually distinguished on a timeline corresponding to the video. For example, a long video may have a large number of annotations associated with a variety of intervals. Indications of annotated clips might be difficult to visually distinguish on the timeline due to limitation on the image size and resolution. In some circumstances, more groups may be needed for a longer video than for a shorter video. In light of the difficulty of visually distinguishing large numbers of indications of annotated clips on a timeline, grouping module 112 can set a maximum amount of groups that it will form based on this visual indication. Thus, even though there may be more than, for example, 10 annotated clips, grouping module 112 may limit the indications displayed to the 10 most annotated clips in a given video. In addition, grouping module 112 can also limit an action-packed short video to a maximum number of annotated clips to ease visual distinction of the indications on a time line as well.

For a given video, the annotation determination module 114 determines 230 a group having related annotations in a variety of ways. One of ordinary skill will recognize that the grouping of annotations can be executed using various information retrieval techniques, such as stemming, expansion with related words, vector analysis, and sub-string similarity, as well as natural language process/computational linguistic methods. For example, annotation determination module 114 determines the first group of related annotations based at least in part on a comparison of the content within each annotation. Thus, the same or similar words within different annotations can be used to determine that the annotations are related within a group (e.g. annotations with the words "New York City" and "New York" would be related because they contain the same first eight characters).

In another example, annotation determination module 114 assigns a weight to each annotation based on whether the annotation was provided by a unique user and determines the group based on the assigned weights of the annotations. Thus, the group may be determined to have related annotations based on the weight assigned to each annotation (e.g. annotations submitted by the same user have a lesser weight, and are therefore considered less likely to be related for the determination of a group).

Annotation determination module 114 may also assign a weight to each annotation based on the reputation score associated with the annotation. An annotation may be associated with a reputation score, for example, based on whether the annotation was submitted by a new or unrecognized user, the usefulness of the annotations previously submitted by the user, the number of annotations by the user that are approved by others, or other information about the user within user database 140.

The clip generation module 116 is adapted to form 240 a clip of a video based on the intervals in a given group. There are various ways to form clips. In one embodiment, the clip generation module 116 examines only the start time of the intervals that have received annotations. Thus, all of the considered intervals will start at some time instant within the video and continue to the end of the video. Alternatively, clip generation module 116 may consider both start and end times for intervals that have received annotations. Clip generation module 116 can then use these times to determine the earliest (or latest) point of any interval in the group, optionally may round these times to the start of the scene just before (or after) it.

In another embodiment, clip generation module 116 projects the contribution of each of the intervals in the group on a time line, such as by adding the weight of the annotations for each interval, or the logarithm of the number of annotations for each time instant. The clip generation module 116 then fits a probabilistic model to the distribution (e.g., Gaussian distribution) by standard statistical methods, and then selects the mean as the center. The clip generation module 116 can then select a certain number (e.g., three) of standard deviations to either side of the mean, providing that the start and end times are rounded to the scene boundaries.

In another embodiment, the clip generation module 116 examines traffic traces to determine how much each instant of the video was watched by different users, which may include those who have not submitted any annotations. This information can also be used in conjunction with the above methods to determine where a clip should begin and end. In one embodiment, the instances of video that have received the most traffic within a given time period are considered to be part of the same clip and are used in determining the length of the clip.

For example, assume a 3:00 minute video depicts an actor on a motorcycle performing a stunt, such as jumping over a shark in the water, with the apex of the jump taking place at 2:00. One annotation might be for an interval from two seconds prior to and two seconds after the jump (e.g. 1:58-2:02); another annotation might be for the apex of the jump (e.g. 2:00); a third annotation might be for the interval lasting from before the jump until after the motorcycle has safely landed (e.g. 1:50-2:10). Based on these intervals, clip generation module 116 forms the annotated clip (e.g. 1:54-2:06). In this example, clip generation module 116 forms the annotated clip by averaging the time within the intervals associated with the three annotations.

Synoptic annotation module 117 forms a synoptic annotation for the first annotated clip of video based on the related annotations in the first group. In one embodiment, synoptic annotation module 117 creates a synoptic annotation by summarizing the content of the related annotations in the first group. One of ordinary skill will recognize that a summary of annotations can be executed using various techniques such as concatenating the annotations or using "snippet" generation methods, as in web search interfaces. Another technique for summarizing annotations is using string similarity, such as various edit distances between strings to determine the 1-center (the annotation that has the minimum of the maximum distance to all the other annotations). In another embodiment, a summary annotation could be created based on common subsequence analysis (as in Computational Biology where genomic sequences are analyzed).

In one example, synoptic annotation module 117 creates a synoptic annotation by providing excerpts of the related annotations. As an example, suppose three annotations are submitted: (1) "Fonzie jumps the shark" (2) "Fonz takes off" and (3) "Shorts and a leather jacket: that is jumping the shark." A synoptic annotation that summarizes the content of the three annotations might read: "Fonz, in shorts and a leather jacket, takes off and jumps the shark." A synoptic annotation that excerpts the related annotations might read: "Fonzie jumps the shark . . . takes off . . . shorts and a leather jacket."

The ranking module 120 ranks annotated clips based on the number of annotations in each group. The ranking module 120 also ranks annotated clips across multiple videos. As can be appreciated, the various modules can determine the number of annotations for each clip in any number of videos to identify the most annotated clips overall.

The ranking module 120 can be used in conjunction with video searching as well, such that videos that are determined to be responsive to a search query can be ranked based on the annotations for groups for each responsive video. In one embodiment, the ranking module 120 determines the rank of the videos based on the number of annotations for the most annotated interval in each video (e.g., the highest ranked video would be the video containing a clip that received the highest number of annotations). In another embodiment, the ranking module 120 determines the rank of the videos based on the total number of annotations received for all groups within each video (e.g. the highest ranked video would be the video that received the most annotations across all clips within that video).

The display module 118 provides for the display of an indication of annotated clips on a timeline associated with the videos. This allows a user to efficiently understand and access the annotated clips in one or more videos. The display module 118 can also create an annotated highlights segment or trailer of a given video by forming an annotated excerpt of a video that includes a first annotated clip and a second annotated clip and displaying the annotated excerpt.

The video database 128 stores lists of the videos with annotated clips. The lists may be grouped by genre, rating, or any other property. The lists of related videos are updated hourly, in one example, by performing an analysis of annotation activity from user database 140. Once the lists of the most annotated clips have been generated, the video server 126 extracts the videos from the video database 128 based on the lists, as well as the annotations from user database 140, and provides the annotated videos to users for viewing.

In FIG. 3, clients submitted numerous annotations 310A-310E, which are depicted on timeline 302. As will be discussed with respect to FIG. 8, annotations 310A-310E (with other annotations, not shown) have been used to form annotated clips of video. For example, annotations 310A and 310B have been used (with other annotations, not shown) to form an annotated clip indicated by the reference numeral 810; annotations 310C-310D have been used to form an annotated clip indicated by reference numeral 820; annotation 310E has been used to form an notated clip indicated by reference numeral 830.

Figure 6:
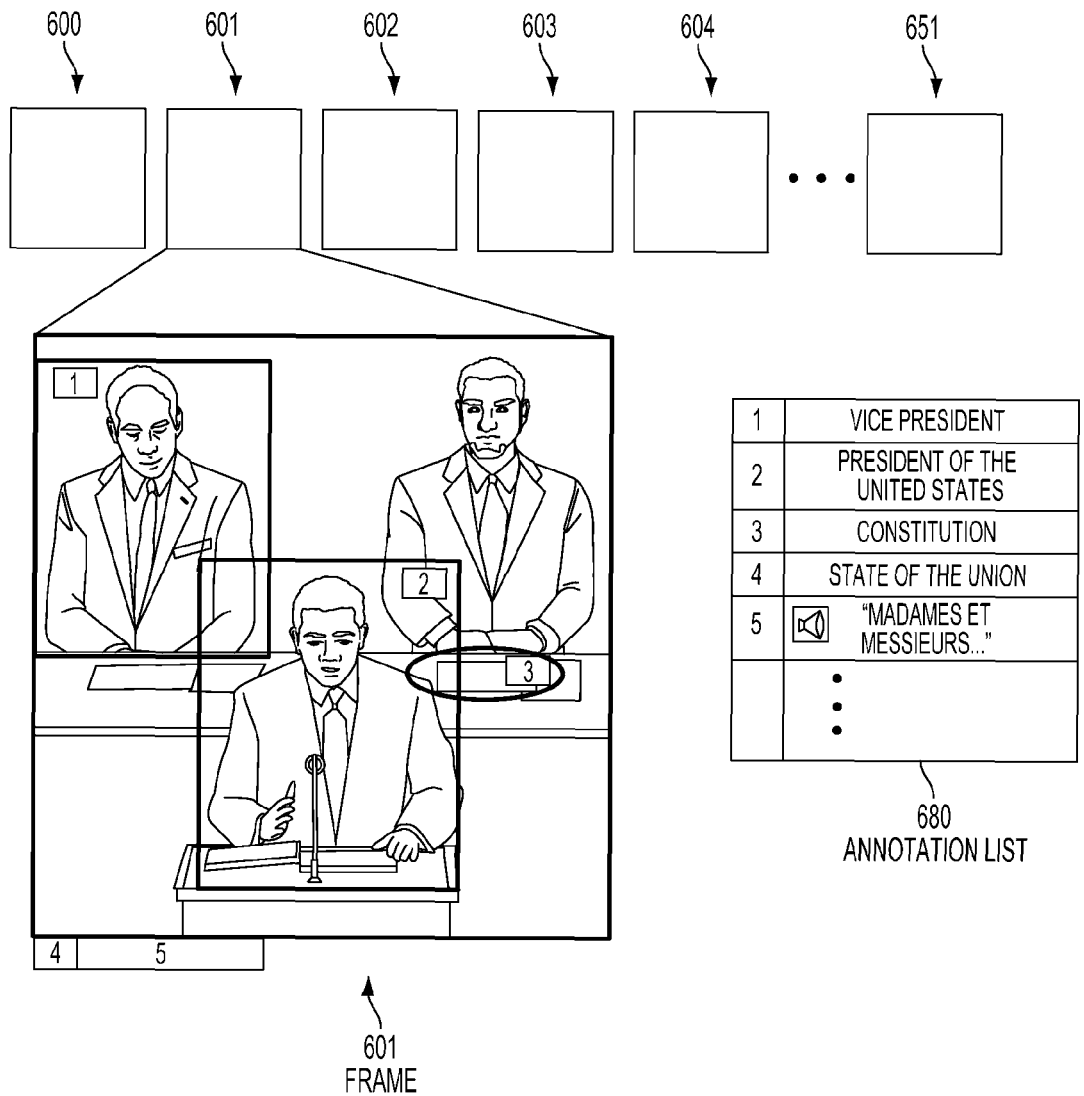
FIG. 6 illustrates frames of a video, and the indexing of annotations to one or more frames.
Figure 7A:
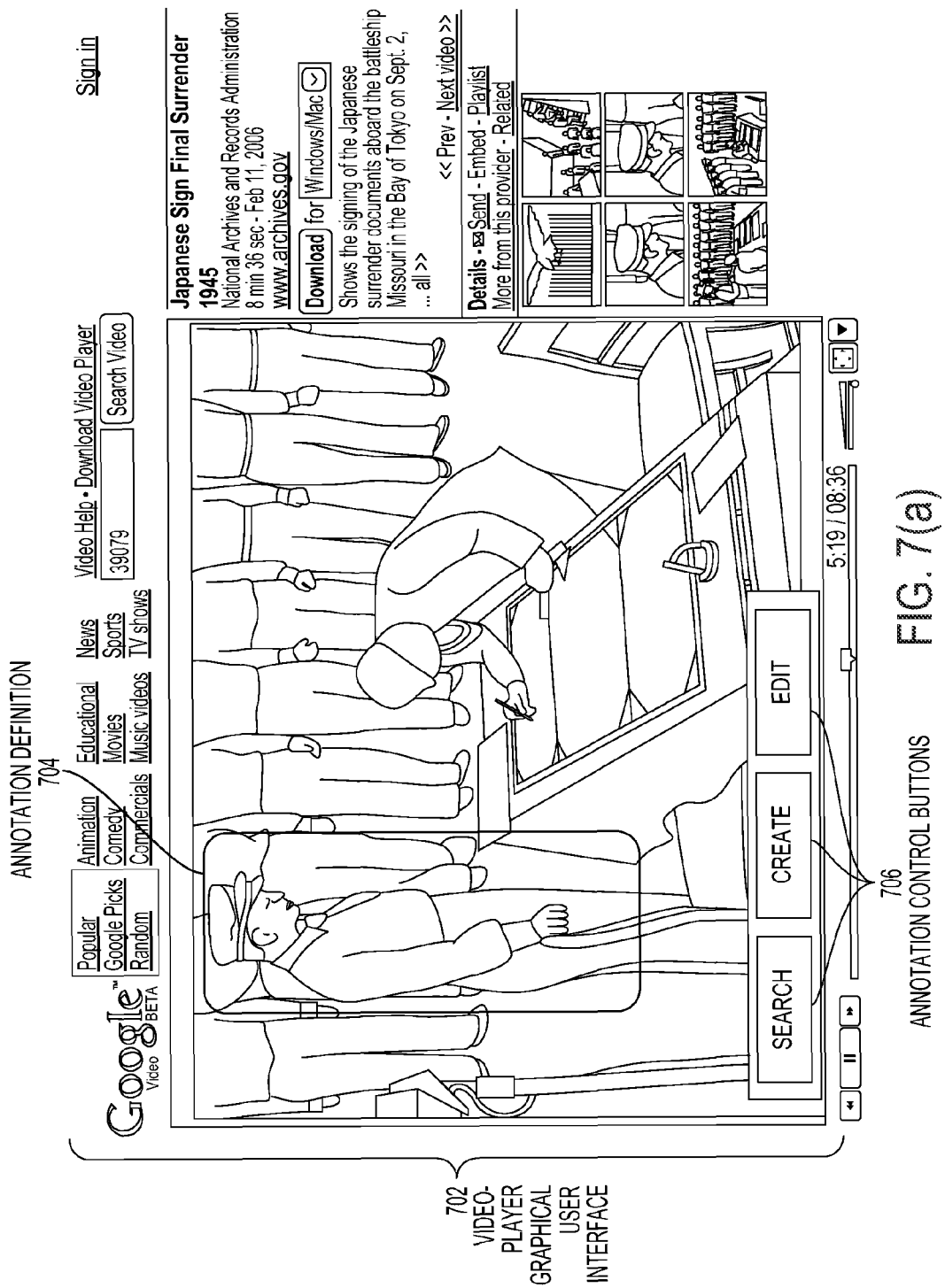
FIG. 7(a) illustrates a user interface for viewing, creating, and editing annotations.
Figure 7B:
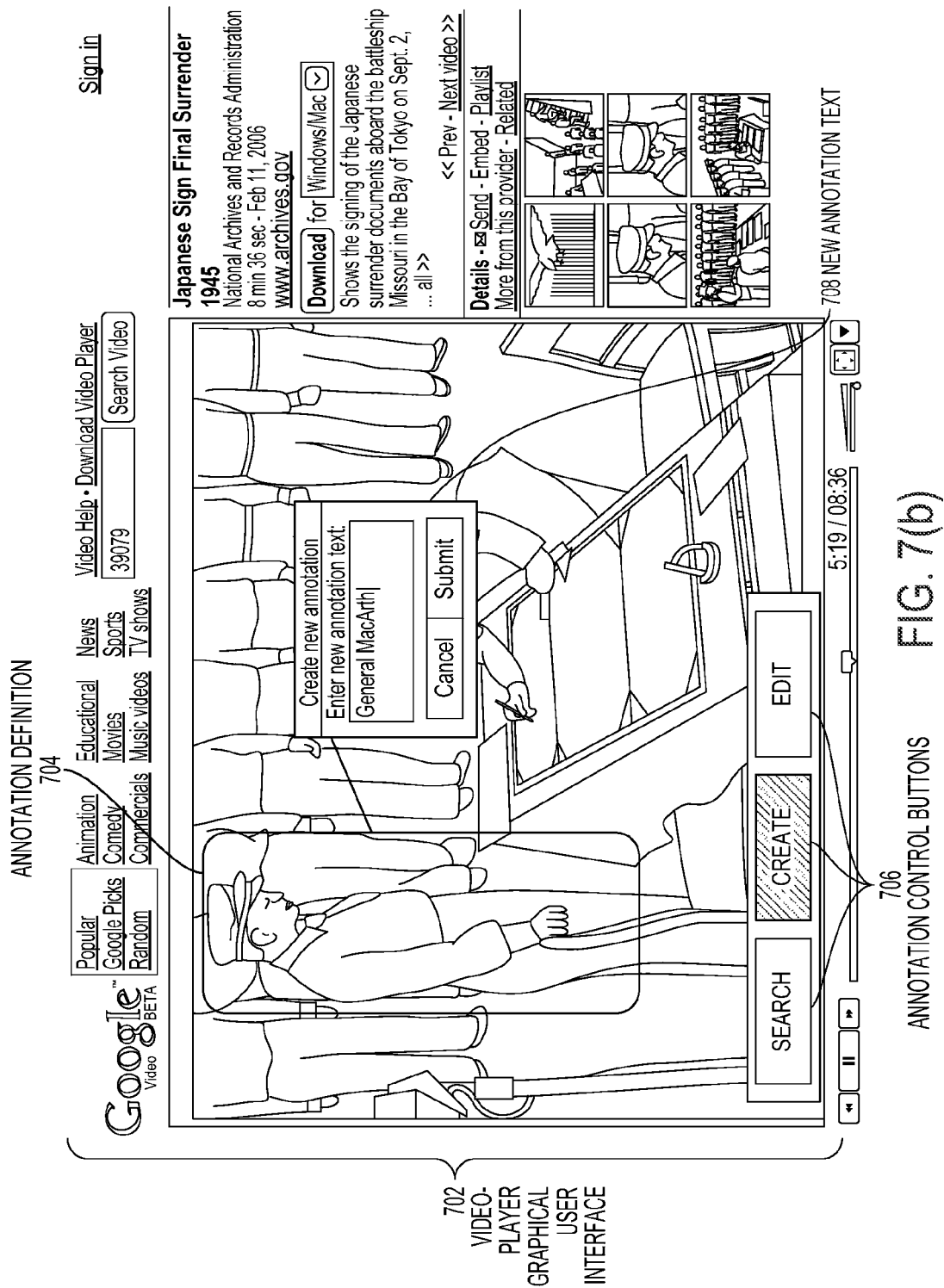
FIG. 7(b) illustrates a user interface for creating a new annotation.

Referring now to FIG. 6, there is shown a conceptual diagram illustrating how annotations are associated temporally and/or spatially with a video file and one or more frames of thereof. FIG. 6 shows a series of video frames, running from frame 600 to frame 651. The client 130 displays these frames, and can also pause, rewind, fast-forward, skip, or otherwise adjust the order or speed with which the frames are displayed.

For the purposes of illustration, this discussion refers to a video as being composed of frames. Video is sometimes stored or transmitted as blocks of frames, fields, macroblocks, or in sections of incomplete frames. When reference is made herein to video being composed of frames, it should be understood that during intermediate steps video may in fact be stored as any one of various other forms. The term "frame" is used herein for the sake of clarity, and is not limiting to any particular format or convention for the storage or display of video.

Some of the frames have annotations associated with them as provided by a particular user. In the example illustrated, frame 601 is drawn in greater to detail to illustrate some of its associated annotations. As shown in the figure, annotations can be associated with a particular spatial location of a frame, or they can be associated with an entire frame. For example, annotation 1 is associated with a rectangular box in the upper-left corner of frame 601. In contrast, annotation 4 is associated with the entire frame.

Annotations can also be associated with overlapping spatial locations. For example, annotation 1 is associated with a rectangular box overlapping a different rectangular box associated with annotation 2. In one embodiment, annotations can be associated with a spatial location defined by any closed form shape. For example, as shown in FIG. 6, annotation 3 is associated with spatial locations defined by an elliptical shape.

Annotation list 680 maintains associations between the spatial definition of annotations and the content of annotations. Annotation 1, associated with a rectangular box in frame 601, includes the text "Vice President." Annotation 1 is an example of an annotation useful for highlighting or adding supplemental information to particular portions of a frame. Annotation 4 is associated with the entire frame 601 and contains the text "State of the Union." Annotation 4 is an example of an annotation used to summarize the content of a frame. Annotation 5 is associated with the entire frame 601 and contains some audio, which, in this case, is a French audio translation. Annotation 5 is an example of an annotation used to provide supplemental audio content.

Annotations can also have temporal associations with a media file or any portion thereof. For example, an annotation can be associated with a specific frame, or a specific range of frames. In FIG. 6, for example, annotation 2 could be associated with frame 600 to frame 651, while annotation 5 is associated only with frame 601. The spatial definition associated with an annotation can also change over time. For example, annotation 1 can be associated with a first region in frame 601, and with a second region in frame 602. Time and spatially-dependent annotation associations are particularly useful for providing supplemental information regarding objects in motion, and can accommodate, as in the example shown in the figure, the movement of the Vice-President of the United States. The temporal associations can be defined in terms of frame numbers, time codes, or any other indexing basis. The illustration of the annotation list 680 as a table is not meant to limit the underlying storage format used; any format or organization of the annotation information may be employed including optimized formats that reduce storage requirements and/or increase retrieval speed.

During playback of a media file, the client 130 is adapted to display the annotations associated with the frames of the file. Annotations can be displayed, for example, as text superimposed on the video frame, as graphics shown alongside the frame, or as audio reproduced simultaneously with video; annotations may also appear in a separate window or frame proximate to the video. Annotations can also include commands for how the media file with which they are associated is to be displayed. Displaying command annotations can include displaying video as instructed by the annotation. For example, responsive to an annotation, the client 130 might skip to a different place in a video, display a portion of the video in slow motion, or jump to a different video altogether.

The client 130 is capable of displaying a subset of the available annotations. For example, a user watching the video of FIG. 6 can select which annotations should be displayed by the client 130 by designation of various criteria. The user can choose to receive only certain types of annotations (e.g. commentary, text, graphic, audio), or only annotations that are defined by a particular region of the display. The user can choose to receive only annotations in a particular language, matching a certain search criteria (such as keywords), or authored by a particular user. As another example, when annotations are written and edited in a collaborative community of users, a user can choose to receive only annotations authored by users with reputations above a certain threshold, or to receive only annotations with ratings above a certain threshold.

Users can also search for annotations, and retrieve associated video based on the results of the annotation search.

Certain annotations can be given a priority that does not allow a user to prevent them from being displayed. For example, annotations can include advertisements, which may be configured so that no other annotations are displayed unless the advertisement annotations are also displayed. Such a configuration would prevent users from viewing certain annotations while avoiding paid advertisement annotations. In addition, certain annotations could be provided by the content provider, such as "tags" that contain brief snippets of content to facilitate navigation of the video. The distinction of a content provider's "tag" could indicate to the user that the annotation is from a reputable source.

Figure 10:
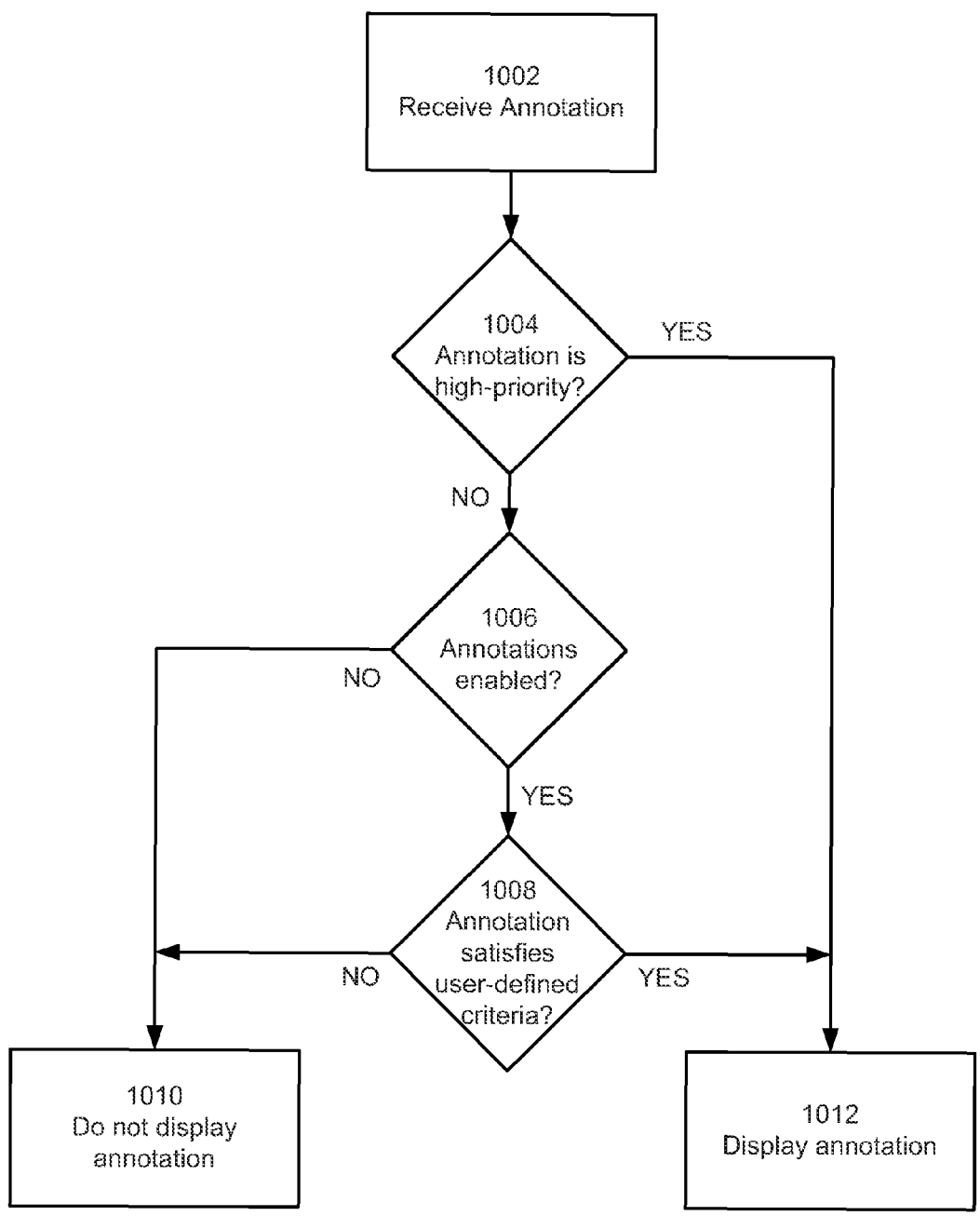
FIG. 10 illustrates a method for determining which annotations to display.

A method for determining which annotations to display is described herein with reference to FIG. 10. For example, a user might only want to have the personalized bookmark annotations she has authored displayed. Or, she might only want the bookmark annotations of a trusted group of her friends and family to be shown.

Optionally, the client receives changes to the annotation from the user. For example, a user can edit text, re-record audio, modify metadata included in the annotation content, or change an annotation command. The client transmits the modified annotation to the video server, or, alternatively, transmits a description of the modifications the video server. The video server receives the modified annotation, which is stored in the user database.

For example, a user viewing the annotations shown in FIG. 6 may be dissatisfied with annotation 1. The user changes the annotation text "Vice President" to "Vice President of the United States" using an input device connected to the client 130. Future display of the annotation (to this user or possibly other users) would include the modified text "Vice President of the United States." As another option, a user can change the temporal or spatial definition with which annotations or associated. For example, the astute user may recognize that the documents shown on the right side of the frame are actually excerpts from 15 USC §§78dd-1, and that the Constitution (despite being almost completely obscured by the position of the President) is just barely visible on the left side of the frame. The user can change the temporal definition with which Annotation 3 is associated accordingly, for example, by dragging (for example, in a direct manipulation user interface illustrating frames of the video) the spatial definition to a different location using an input device connected to the client 130.

The annotation list 680 is shown in FIG. 6 for the purposes of illustration as one example of how annotations and their associated frames can be organized. The annotation list 680 is useful for managing and displaying annotations associated with a frame or range of frames, but annotations could be organized differently without departing from the scope of the present invention.

As also described herein with reference to FIG. 6, an annotation can be associated with a range of frames in a video. A set of one or more frames of video is sometimes referred to as an interval of video.

Referring now to FIG. 7(*a*), a user can search, create, or edit annotations using a graphical user interface. In the example illustrated, the graphical user interface for annotations is integrated into a video player graphical user interface 702. The video player graphical user interface 702 is an example of an interface that might be shown on the display device of a client 130. The video player graphical user interface 702 includes a display area for presenting the media file (in the example illustrated, a video), as well as control buttons for selecting, playing, pausing, fast forwarding, and rewinding the media file. The video player graphical user interface 702 can also include advertisements, such as the advertisement for the National Archives and Records Administration shown in FIG. 7(*a*).

The video player graphical user interface 702 presents a frame of video. Shown along with the frame of video is an annotation definition 704. The annotation definition 704 graphically illustrates the spatial definition and/or the temporal definition of an annotation. For example, the annotation definition 704 shown in FIG. 7(*a*) delineates a subset of the frame with which an annotation is associated. As another example, an annotation definition 704 can delineate a range of frames with which an annotation is associated. While a single annotation definition 704 is shown in FIG. 7(*a*), the video player graphical user interface 702 can include a plurality of annotation definitions 704 without departing from the scope of the invention.

The annotation definition 704 can be displayed in response to a user selection, or as part of the display of an existing annotation. For example, the user can use an input device to select a region of the frame with which a new annotation will be associated, and in response to that selection the video player graphical user interface 702 displays the annotation definition 704 created by the user. As another example, the video player graphical user interface 702 can display video and associated annotations, and can display the annotation definition 704 in conjunction with displaying an associated annotation.

The video player graphical user interface 702 also includes annotation control buttons 706, which allow the user to control the content and display of annotations. For example, the video player graphical user interface 702 can include a button for searching annotations. In response to the selection of the search annotations button, the client searches for annotations associated with the annotation definition 704 (or a similar definition), or for annotations associated with a keyword. The results of the search can then be displayed on the video player graphical user interface 702. As another example, the video player graphical user interface 702 can include a button for editing annotations. In response to the selection of the edit annotations button, the video player graphical user interface 702 displays one or more annotations associated with the annotation definition 704 and allows the user to modify the one or more annotations. As yet another example, the video player graphical user interface 702 can include a button for creating a new annotation. In response to the selection of the create new annotation button, the video player graphical user interface 702 displays options such as those shown in FIG. 7(*b*).

Referring now to FIG. 7(*b*), the annotation control buttons 706 indicate that the create new annotation button has been selected. The video player graphical user interface 702 includes a display area for receiving user input of the new annotation content. In the example illustrated, the new annotation content includes some new annotation text 708. As shown in FIG. 7(*b*), as the user enters the description "General MacArthur", the new annotation text 708 is displayed. In response to a further user selection indicating the authoring of annotation content is complete, the new annotation is submitted, for example, to the video server 126, and displayed in the video player graphical user interface 702.

The entering of new annotation text 708 has been shown as an example of the authoring of annotation content. The video player graphical user interface 702 can be adapted to receive other types of annotation content as well. For example, annotation content can include audio, and the video player graphical user interface 702 can include a button for starting recording of audio through a microphone, or for selecting an audio file from a location on a storage medium. Other types of annotations and similar methods for receiving their submission by a user will be apparent to one of skill in the art without departing from the scope of the invention.

Figure 8:
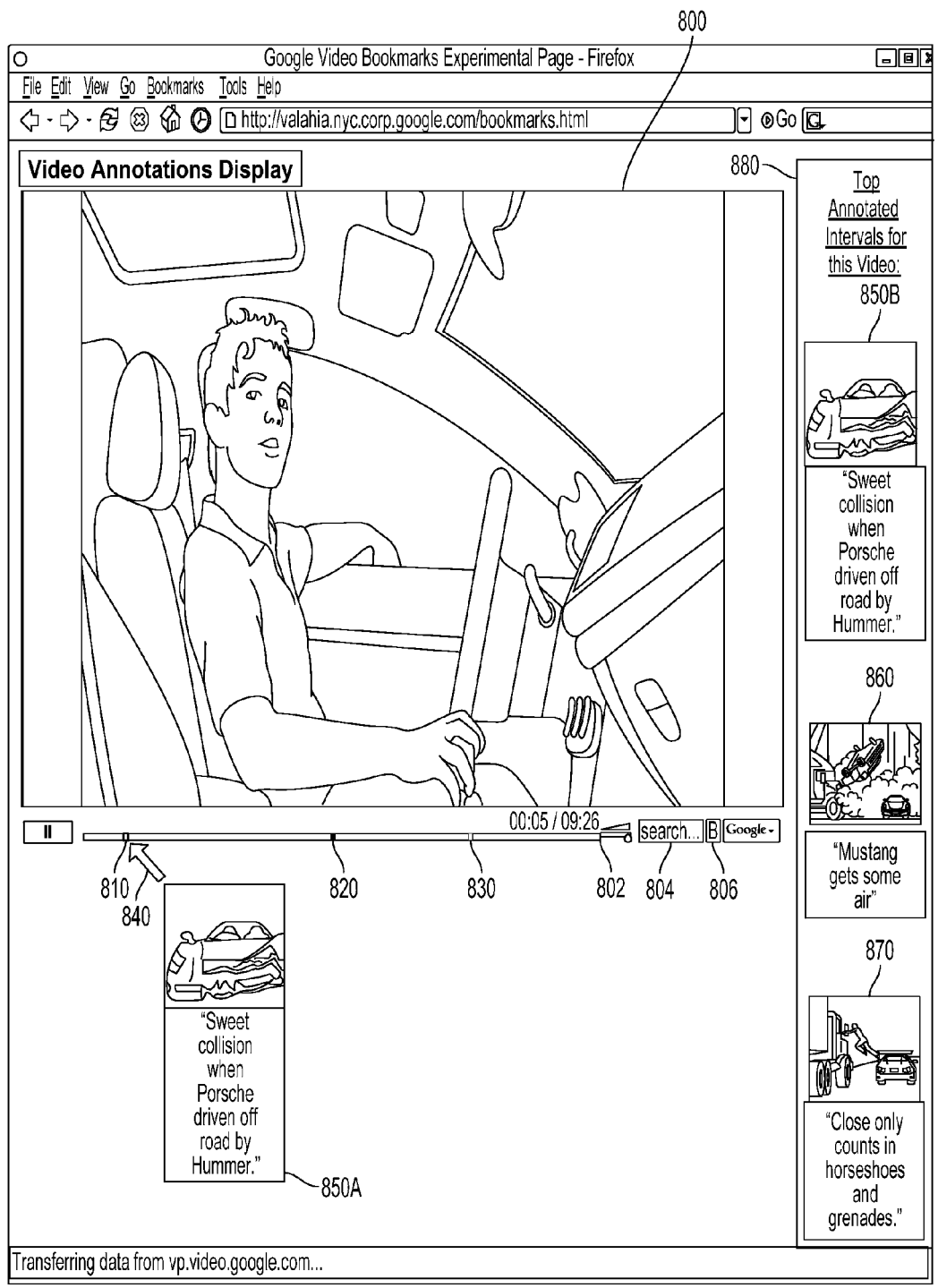
FIG. 8 illustrates a user interface for entering annotations for intervals of video and viewing annotated clips of video in accordance with one embodiment of the present invention.

Turning now to FIG. 8, each of the annotated clips shown on timeline 802, which corresponds to video 800, is associated with an annotated thumbnail. For example, when cursor 840 is placed over the indication for annotated clip 810, annotated thumbnail 850A appears. In one embodiment, the ranked annotated clips can also be shown in another section 880 of the user interface. For example, thumbnail 850B corresponds to the most annotated clip for video 800; thumbnail 860 corresponds to the second most annotated clip; thumbnail 870 corresponds to the third most annotated clip. The indications on timeline 802 can be numbered to indicate their rank order. The user interface depicted in FIG. 8 also allows the user to submit an annotation for an interval by clicking on "B" button 806 while viewing the indications of the most annotated clips.

In another embodiment, users can access annotated clips for videos using a DVR or a device providing similar functionality. By using a remote control or a viewing default, users of a device can access annotated clips within a single video and across multiple videos. This would allow users to view the highlights of a given video or set of videos (such as the sports highlights for a given time period).

Figure 9:
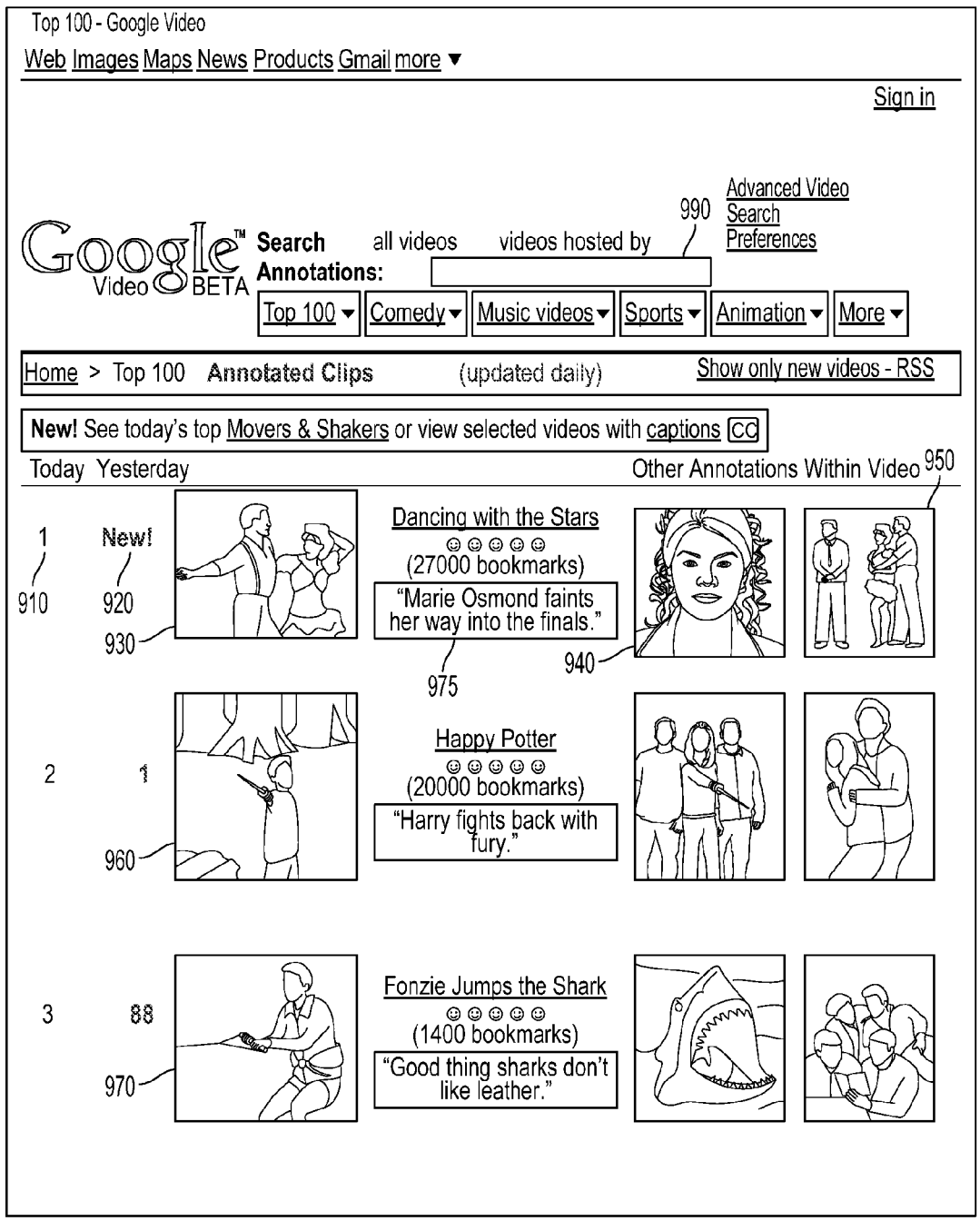
FIG. 9 illustrates a user interface for viewing annotated clips of video in accordance with one embodiment of the present invention.

Turning now to FIG. 9, another example of the display of annotated clips is illustrated. This user interface indicates the top annotated clips over the course of two days. For example, the most annotated clip "1" 910 for the current day is depicted as thumbnail 930, along with annotation 975. Because the interval was not available the day before, the video interval is listed as "New!" 920. Thumbnails 940 and 950 depict the second and third most annotated clips from the video containing the most annotated clip. The second most annotated clip thumbnail 960 from a second video and third most annotated clip thumbnail 970 from a third video for the current day are also depicted below the most annotated clip thumbnail 930. The web page also has a search box 990 to allow for searching the content of the annotations.

The ranked list of annotated clips for all videos is stored in the video database 128. The ranked list of video clips is updated on an hourly basis, according to one embodiment. This ensures the most up to date relevant videos is presented to users. The ranked list may also be updated on a daily basis. The time in which the ranked list is updated is merely illustrative of the times in which an appropriate update can take place and the update can occur at any suitable time set by the administrator of the video hosting website 108.

FIG. 10 illustrates a method for determining which annotations to display. In one embodiment, the client 130 displays only some of the received annotations. The client 130 performs a method such as the one illustrated in FIG. 10 to determine which annotations should be displayed and which should not.

The client 130 receives 1002 an annotation. The client determines 1004 if the annotation is high-priority. A high-priority annotation is displayed regardless of user settings for the display of annotations. High-priority annotations can include, for example, advertisements, emergency broadcast messages, or other communications whose importance that should supersede local user settings.

If the client 130 determines 1004 that the annotation is high-priority, the client displays 1012 the annotation. If the client 130 determines 1004 that the annotation is not high-priority, the client determines 1006 if annotations are enabled. Annotations can be enabled or disabled, for example, by a user selection of an annotation display mode. If the user has selected to disable annotations, the client 130 does not display 1010 the annotation. If the user has selected to enable annotations, the client 130 determines 1008 if the annotation matches user-defined criteria.

As described herein, the client 130 allows the user to select annotations for display based on various criteria. In one embodiment, the user-defined criteria can be described in the request for annotation, limiting the annotations sent by the video server 126. In another embodiment, the user-defined criteria can be used to limit which annotations to display once annotations have been received at the client 130. User defined-criteria can specify which annotations to display, for example, on the basis of language, annotation content, particular authors or groups of authors, or other annotation properties.

If the client 130 determines 1008 that the annotation satisfies the user-defined criteria, the client 130 displays 1012 the annotation. If the client 130 determines 1008 that the annotation does not satisfy the user-defined criteria, the client 130 does not display 1010 the annotation.

FIG. 10 illustrates one example of how the client 130 may determine which annotations to display. Other methods for arbitrating annotation priorities established by the annotation provider and the annotation consumer will be apparent to one of skill in the art without departing from the scope of the present invention.

The case of a video server and a client is but one example in which the present invention may be usefully employed for the management of annotations for video. It will be apparent to one of skill in the art that the methods described herein will have a variety of other uses without departing from the scope of the present invention. For example, the features described herein could be used in an online community in which users can author, edit, review, publish, and view annotations collaboratively. Such a community would allow for open-source style production of annotations without infringing the copyright protections of the video with which those annotations are associated.

As an added feature, a user in such a community could also accumulate a reputation, for example based on other users' review of the quality of that user's previous authoring or editing. A user who wants to view annotations could have the option of ignoring annotations from users with reputations below a certain threshold, or to search for annotations by users with reputations of an exceedingly high caliber. As another example, a user could select to view annotations only from a specific user, or from a specific group of users.

As described herein, annotations can also include commands describing how video should be displayed, for example, commands that instruct a display device to skip forward in that video, or to jump to another video entirely. A user could author a string of jump-to command annotations, effectively providing a suggestion for the combination of video segments into a larger piece. As an example, command annotations can be used to create a new movie from component parts of one or more other movies.

The present invention has applicability to any of a variety of hosting models, including but not limited to peer-to-peer, distributed hosting, wiki-style hosting, centralized serving, or other known methods for sharing data over a network.

The annotation framework described herein presents the opportunity for a plurality of revenue models. As an example, the owner of the video server 126 can charge a fee for including advertisements in annotations. The video server 126 can target advertisement annotations to the user based on a variety of factors. For example, the video server 126 could select advertisements for transmission to the client based on the title or category of the video that the client is displaying, known facts about the user, recent annotation search requests (such as keyword searches), other annotations previously submitted for the video, the geographic location of the client, or other criteria useful for effectively targeting advertising.

Access to annotations could be provided on a subscription basis, or annotations could be sold in a package with the video content itself. For example, a user who purchases a video from an online video store might be given permission for viewing, editing, or authoring annotations, either associated with that video or with other videos. An online video store might have a promotion, for example, in which the purchase of a certain number of videos in a month gives the user privileges on a video server 126 for that month.

These examples of revenue models have been given for the purposes of illustration and are not limiting. Other applications and potentially profitable uses will be apparent to one of skill in the art without departing from the scope of the present invention.

In addition, methods of spam control would help ensure the security of the sharing of the annotations.

Reference in the specification to "one embodiment" or to "an embodiment" means that a particular feature, structure, or characteristic described in connection with the embodiments is included in at least one embodiment of the invention. The appearances of the phrase "in one embodiment" in various places in the specification are not necessarily all referring to the same embodiment.

It should be noted that the process steps and instructions of the present invention can be embodied in software, firmware or hardware, and when embodied in software, can be downloaded to reside on and be operated from different platforms used by a variety of operating systems.

The present invention also relates to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and displays presented herein are not inherently related to any particular computer or other apparatus. Various general-purpose systems may also be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the present invention as described herein, and any references below to specific languages are provided for disclosure of enablement and best mode of the present invention.

While the invention has been particularly shown and described with reference to a preferred embodiment and several alternate embodiments, it will be understood by persons skilled in the relevant art that various changes in form and details can be made therein without departing from the spirit and scope of the invention.

Finally, it should be noted that the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention, which is set forth in the following claims.

What is claimed is:

1. A method for annotating a video, comprising:
   displaying by a computer on a device a video player graphical user interface, the user interface including a display area for presenting a video and associated control buttons, the video including a plurality of annotated intervals;

displaying, by the computer, a timeline associated with the video;

displaying, by the computer in the display area, a frame of the video ;

receiving, by the computer, a user selection of a region of the displayed frame;

responsive to receiving the selection of the region, displaying, by the computer in the displayed frame, an annotation definition image indicating the selected region;

receiving, by the computer, a user selection of a control button to create an annotation;

providing, by the computer, a display area for receiving user input of annotation content;

receiving, by the computer in the display area, user input of annotation content;

associating the received annotation content with the displayed frame of the video and the selected region to generate an annotated video frame;

ranking the plurality of annotated intervals based on a number of annotations associated with each annotated interval;

indicating on the timeline a marker associated with the annotated video frame;

while displaying the timeline, displaying an annotated thumbnail associated with the annotated video frame in the user interface responsive to a user interaction with the marker; and displaying indications of ranked orders with markers associated with each of the annotated intervals on the timeline.

2. The method of claim 1 further comprising:
receiving, by the computer, a user selection of a control button to search for an annotation;
receiving, by the computer from the user, a search query;
receiving indicia of at least one video having annotation content matching the search query; and
displaying the received indicia on the display device.

3. The method of claim 2 further comprising:
receiving, by the computer, a selection of indicia of one of the videos having the matching annotation content; and
displaying, by the computer, the indicated video including the matching annotation content.

4. The method of claim 1 further comprising:
receiving, by the computer, a user selection of a control button to edit the annotation; and
receiving, by the computer, user input of revised annotation content.

5. The method of claim 1, wherein displaying the frame of the video further comprises:
playing the video in the user interface;
receiving, during playback of the video, user selection of a control button;
ceasing playback of the video;
selecting a frame of the video responsive to a portion of the video being played back at the time of receiving the user selection; and
displaying the selected frame in the user interface.

6. The method of claim 1 wherein the display area for receiving user input of annotation content is displayed as a pop-up window within the region.

7. The method of claim 1 wherein the video includes a plurality of annotated frames, and the timeline includes a plurality of markers associated with the annotated frames.

8. The method of claim 7 wherein at least one of the annotated markers represents more than one annotated frame of the video.

9. The method of claim 1 further comprising:
playing the video including the annotated video frame in the user interface, and wherein playing the annotated video frame includes displaying the annotation content with the annotated video frame.

10. The method of claim 9 wherein the annotation content is at least one of text superimposed on the annotated video frame, graphics shown alongside the annotated video frame, and audio reproduced simultaneously with the annotated video frame.

11. The method of claim 1, further comprising:
receiving a user input at the timeline indicating an interval of the video, the indicated interval including a plurality of frames;
wherein the displayed frame comprises one or more frames of the plurality of frames, and wherein the marker identifies the interval.

12. A method displaying annotated video, comprising:
displaying by a computer on a device a video player graphical user interface, the user interface including a display area for presenting a video and associated control buttons, the video including a plurality of annotated intervals;
displaying, by the computer, a timeline associated with the video;
displaying, by the computer in the display area, a frame of the video ;
receiving, by the computer, a user selection of a region of the displayed frame;
responsive to receiving the selection of the region, displaying, by the computer in the displayed frame, an annotation definition image indicating the selected region;
receiving, by the computer, a user selection of a control button to create an annotation;
providing, by the computer, a display area for receiving user input of annotation content;
receiving, by the computer in the display area, the user input of annotation content;
associating the received annotation content with the displayed frame of the video and the selected region to generate an annotated video frame;
ranking the plurality of annotated intervals based on a number of annotations associated with each annotated interval;
indicating on the timeline a marker associated with the annotated video frame;
while displaying the timeline, displaying an annotated thumbnail associated with the annotated video frame in the user interface responsive to a user interaction with the marker; and
displaying indications of ranked orders with markers associated with each of the annotated intervals on the timeline.

13. The method of claim 12 further comprising:
receiving, by the computer, a selection of indicia of one of the videos having the matching annotation content; and
displaying, by the computer, the indicated video including the matching annotation content.

14. A computer program product for annotating a video, the computer program product stored on a non-transitory computer-readable medium and including instructions configured to cause a processor to execute steps comprising:

displaying by a computer on a device a video player graphical user interface, the user interface including a display area for presenting a video and associated control buttons, the video including a plurality of annotated intervals;

displaying, by the computer, a timeline associated with the video;

displaying, by the computer in the display area, a frame of the video ;

receiving, by the computer, a user selection of a region of the displayed frame;

responsive to receiving the selection of the region, displaying, by the computer in the displayed frame, an annotation definition image indicating the selected region;

receiving, by the computer, a user selection of a control button to create an annotation;

providing, by the computer, a display area for receiving user input of annotation content;

receiving, by the computer in the display area, the user input of annotation content;

associating the annotation content with the displayed frame of the video and the selected region to generate an annotated video frame;

ranking the plurality of annotated intervals based on a number of annotations associated with each annotated interval;

indicating on the timeline a marker associated with the annotated video frame;

while displaying the timeline, displaying an annotated thumbnail associated with the annotated video frame in the user interface responsive to a user interaction with the marker; and displaying indications of ranked orders with markers associated with each of the annotated intervals on the timeline.

15. The computer program product of claim 14 further comprising:

receiving, by the computer, a user selection of a control button to edit the annotation; and receiving, by the computer, user input of revised annotation content.

16. The computer program product of claim 14, wherein displaying the frame of the video further comprises:

playing the video in the user interface;

receiving, during playback of the video, user selection of a control button;

ceasing playback of the video;

selecting a frame of the video responsive to a portion of the video being played back at the time of receiving the user selection; and displaying the selected frame in the user interface.

17. The computer program product of claim 14 wherein the video includes a plurality of annotated frames, and the timeline includes a plurality of annotated markers associated with the annotated frames, at least one of the annotated markers representing more than one annotated frame.

18. The computer program product of claim 14, further comprising:

playing the video including the annotated video frame in the user interface, and wherein playing the annotated video frame includes displaying the annotations with the annotated video frame.

19. The computer program product of claim 18 wherein the annotations include at least one of text superimposed on the annotated video frame, graphics shown alongside the annotated video frame, and audio reproduced simultaneously with the annotated video frame.

* * * * *